(12) United States Patent
Tashiro et al.

(10) Patent No.: US 6,621,108 B2
(45) Date of Patent: Sep. 16, 2003

(54) SEMICONDUCTOR DEVICE AND THE PROCESS OF MANUFACTURING THE SEMICONDUCTOR DEVICE

(75) Inventors: Yoshiyasu Tashiro, Takasaki (JP); Nobuhiro Kasa, Yoshii (JP); Kousuke Okuyama, Kawagoe (JP); Hiroyasu Ishizuka, Ome (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 09/804,193

(22) Filed: Mar. 13, 2001

(65) Prior Publication Data

US 2001/0025963 A1 Oct. 4, 2001

(30) Foreign Application Priority Data

Mar. 15, 2000 (JP) ......................................... 2000-071795

(51) Int. Cl.[7] ............................................. H01L 31/112
(52) U.S. Cl. ...................... 257/173; 257/355; 257/357; 257/358; 257/359; 257/360
(58) Field of Search ................................. 257/173, 355, 257/357, 358, 359, 360

(56) References Cited

U.S. PATENT DOCUMENTS

| 5,181,091 | A | * | 1/1993 | Harrington, III et al. ... 257/355 |
| 5,326,994 | A | * | 7/1994 | Giebel et al. ................ 257/174 |
| 5,438,213 | A | * | 8/1995 | Tailliet ........................ 257/360 |
| 5,679,971 | A | * | 10/1997 | Tamba et al. ................ 257/357 |
| 6,064,093 | A | * | 5/2000 | Ohta ........................... 257/355 |
| 6,121,661 | A | * | 9/2000 | Assaderaghi et al. ....... 257/355 |
| 6,338,986 | B1 | * | 1/2002 | Kawazoe et al. ........... 438/133 |

FOREIGN PATENT DOCUMENTS

| JP | 404196352 A | * | 7/1992 | ......... H01L/23/522 |
| JP | 8306872 | | 11/1996 | |

* cited by examiner

Primary Examiner—Nathan J. Flynn
Assistant Examiner—Johannes Mondt
(74) Attorney, Agent, or Firm—Antonelli, Terry, Stout & Kraus, LLP

(57) ABSTRACT

Disclosed herein is a semiconductor device wherein a thyristor protective element and a trigger element are provided in a semiconductor layer formed on a buried insulating layer, and a trigger electrode (gate) of the thyristor protective element and a back gate of the trigger element are provided in the same p well and electrically connected to each other to thereby drive the thyristor protective element based on a substrate current produced by the breakdown of the trigger element.

9 Claims, 22 Drawing Sheets

SEMICONDUCTOR DEVICE AND THE PROCESS OF MANUFACTURING THE SEMICONDUCTOR DEVICE

BACKGROUND OF THE INVENTION

The present invention relates to a semiconductor device and to technology for the manufacture thereof; and, more particularly, the invention relates to a semiconductor device having a protection circuit with a thyristor structure and to a technology applicable to a process for manufacturing the semiconductor device.

With advances in micro-fabrication technology in the manufacture of semiconductor devices, the scale-down of elements, wirings, etc., which constitute a semiconductor device, has been an essential element. Correspondingly, the performance of the semiconductor device has increasingly been improved. On the other hand, however, a problem arises in that the scaled-down elements, wirings, etc. are so sensitive to an overvoltage, such as produced by static electricity or the like, that they are apt to break down. There has been a strong demand for the development of mechanisms to prevent degradation and destruction of semiconductor devices due to static electricity or the like and the establishment of a protection structure.

Meanwhile, the present inventors have investigated a protection circuit having a thyristor structure. As a result of this investigation, it has bee found that, for example, Japanese Patent Application Laid-Open No. Hei 8(1996)-306872 discloses a structure wherein a gate terminal and a source terminal of a protection MOS field effect transistor, which is connected to an input terminal, are electrically connected to a ground potential through a trigger terminal of a parasitic PNPN thyristor and an equivalent substrate resistor connected between the collector and emitter of an NPN transistor in the parasitic PNPN thyristor. This technology concerns a circuit structure wherein the potential applied to the base of the NPN transistor is increased based on a voltage drop developed across the equivalent substrate resistor between the collector and emitter to thereby drive the parasitic PNPN thyristor. The cited publication also discloses a technology wherein a parasitic PNPN thyristor and a protection MOS field effect transistor are provided on a semiconductor layer placed on an insulating substrate.

SUMMARY OF THE INVENTION

However, the present inventors have found that a protection circuit having a thyristor structure has the following problems.

First of all, a problem arises in that the turn-on time for the thyristor constituting the protection circuit is delayed. In the technology according to the above-described publication, for example, when a surge voltage is applied to the input terminal, the voltage drop developed across the equivalent substrate resistor exceeds the base-to-emitter voltage of the NPN transistor owing to a current which began to flow due to drain-source breakdown of the protective MOS field effect transistor, whereby the parasitic PNPN thyristor is driven for the first time. Therefore, the turn-on time of the thyristor is delayed.

Secondly, a problem arises in that the device design of a protection circuit having a thyristor structure is difficult. Since the equivalent substrate resistor is affected by a sensitivity characteristic of the parasitic PNPN thyristor in the technology according to the above-cited publication, for example, it is necessary to set its sensitivity characteristic to a suitable value. Since, however, the equivalent substrate resistor varies in its vertical structure (e.g., size, impurity distribution) for each process, it is difficult to form the equivalent substrate resistor in such a manner that the sensitivity characteristic is brought to a suitable value.

Thirdly, a problem arises in that it is difficult to cope with miniaturization or scale-down of each element in an internal circuit. Since the breakdown voltage of the protective circuit is used to protect each element in the internal circuit, it is necessary for the breakdown voltage thereof to be lower than the gate withstand voltage of the internal circuit. However, in the above-cited publication technology, for example, a drain-source breakdown current of the protective MOS field effect transistor begins to flow only when the voltage applied to the input terminal exceeds the sum of a drain-source breakdown voltage of the protective MOS field effect transistor and a base-emitter voltage of a parasitic bipolar transistor. Therefore, it is difficult to set the breakdown voltage of the protection circuit lower than the withstand voltage of a gate insulator for each element in the internal circuit according to the scale-down of each element in the internal circuit.

Fourthly, a problem arises in that, when a so-called SOI (Silicon On Insulator) substrate is used, wherein an element forming a semiconductor layer is provided on an insulating layer, it is difficult for a current produced due to static electricity or the like to escape, whereby the protection circuit needs to have a high discharge capability. Since complete element separation is allowed when the SOI substrate is used, the wiring-to-substrate parasitic capacitance, the diffusion or diffused capacitance, etc. can be reduced, and the operating speed of a semiconductor device can be increased. Accordingly, this substrate is suitable for a semiconductor device having a high-frequency signal circuit. However, while complete element separation is allowed, it is hard for an overcurrent produced clue to static electricity or the like to escape, and element breakdown also will easily take place. Therefore, the protective circuit needs to have high discharge capability (sensitivity) when used in a semiconductor device having a SOI substrate.

An object of the present invention is to provide a technology capable of shortening the turn-on time of a thyristor which constitutes a protection circuit.

Another object of the present invention is to provide a technology capable of facilitating the device design of a protection circuit having a thyristor structure.

A further object of the present invention is to provide a technology capable of implementing a protection circuit configuration which copes with the scale-down of each element in an internal circuit.

A still further object of the present invention is to provide a technology capable of improving the discharge capability of a protection circuit having a thyristor structure.

The above, other objects and novel features of the present invention will become apparent from the description provided herein and from the accompanying drawings.

Summaries of typical aspects of the invention disclosed in the present application will be set forth in brief as follows.

The present invention is featured in that a semiconductor layer is provided on an insulating layer; a thyristor for protection and a trigger element for inducing the driving of the thyristor are provided within the same semiconductor layer separated by a separator extending from the main surface side of the semiconductor layer to the insulating layer; and the gate of the thyristor for protection and a substrate electrode portion of the trigger element are provided within the same semiconductor region and are electrically connected to each other to thereby drive the thyristor, based on a substrate current produced by the breakdown of the trigger element.

Also, in accordance with the present invention, a diode for protection, which is electrically connected between a signal terminal and a terminal for a reference potential in such a manner that the direction of the connection therebetween is taken in the forward direction when an overvoltage is applied to the signal terminal, is provided within the same semiconductor layer.

Further, in accordance with the present invention, a high melting-point silicide layer is provided on a surface layer of a semiconductor region for forming the thyristor for protection and the trigger element.

Furthermore, in accordance with the present invention, a resistor is electrically connected between the substrate electrode portion of the trigger element and the terminal for the reference potential.

Still further, in accordance with the present invention, a resistor is electrically connected between the base of a first bipolar transistor of the thyristor for protection and the signal terminal.

Still further, in accordance with the present invention, the trigger element and each element in an internal circuit are formed upon the same process step.

Still further, in accordance with the present invention, the trigger element is formed in association with each element in the internal circuit.

DESCRIPTION OF THE PREFERRED EMBODIMENTS

Figure 1:
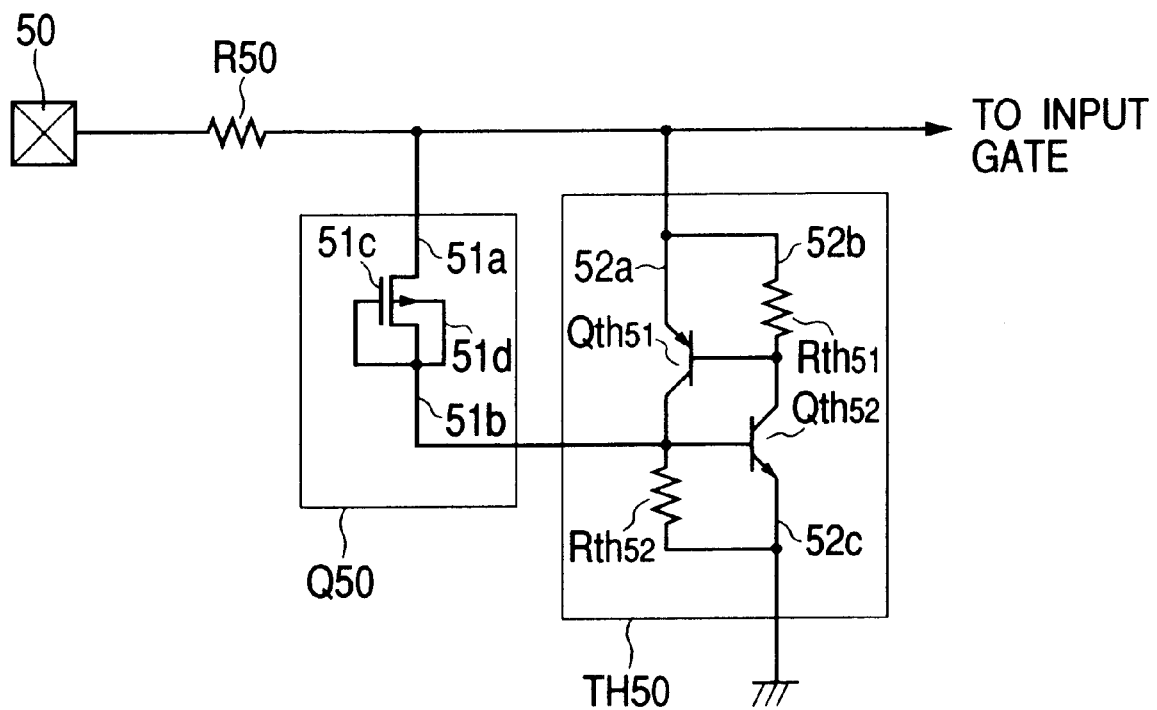
FIG. 1 is a circuit diagram showing a circuit arrangement discussed by the present inventors to implement or achieve the present invention.

Preferred embodiments of the present invention will be described in detail with reference to the accompanying drawings. Incidentally, elements or components having the same functions in all drawings illustrating the embodiments are identified by the same reference numerals and their repetitive description will therefore be omitted.

In the description of the present embodiment, a field effect transistor, (MOS-FET (Metal Oxide Semiconductor Field Effect Transistor) is abbreviated as "MOS", a p channel MOS-FET is abbreviated as "pMOS", and an n channel MOS-FET is abbreviated as "nMOS", respectively.

Embodiment 1

A technology (hereinafter called "inventor-discussed technology") discussed by the present inventors to implement or achieve the present invention will first be explained prior to the description of the present embodiment.

FIG. 1 shows a circuit diagram thereof. An input terminal 50 is electrically connected to a gate (input gate) of a MOSFET constituting an internal circuit through an input protective resistor R50. A protective Q50 and a parasitic PNPN thyristor Qth50 are electrically connected between a wiring, for connecting the input protection resistor R50 and the input gate to the input gate, and a ground terminal.

The protective MOS Q50 has a drain terminal 51a, a source terminal 51b, a gate terminal 51c and a substrate terminal 51d. Further, the parasitic PNPN thyristor TH50 comprises a parasitic PNP bipolar transistor Qth51, a parasitic NPN bipolar transistor Qth52, an equivalent n well resistor Rth51, and an equivalent p substrate resistor Rth52. Reference numeral 52a indicates an emitter terminal of the parasitic PNP bipolar transistor Qth51, reference numeral 52b indicates a potential supply terminal for supplying an n-type well, and reference numeral 52c indicates an emitter terminal of the parasitic NPN bipolar transistor Qth52.

The source terminal 51b, gate terminal 51c and substrate terminal 51d of the protective MOS Q50 are electrically connected to one another and are electrically connected to a trigger electrode portion of the parasitic PNPN thyristor TH50. Namely, the source terminal 51b, gate terminal 51c and substrate terminal 51d of the protective MOS Q50 are electrically connected to the parasitic NRN bipolar transistor Qth52 and the equivalent LD substrate resistor Rth52.

Figure 2:
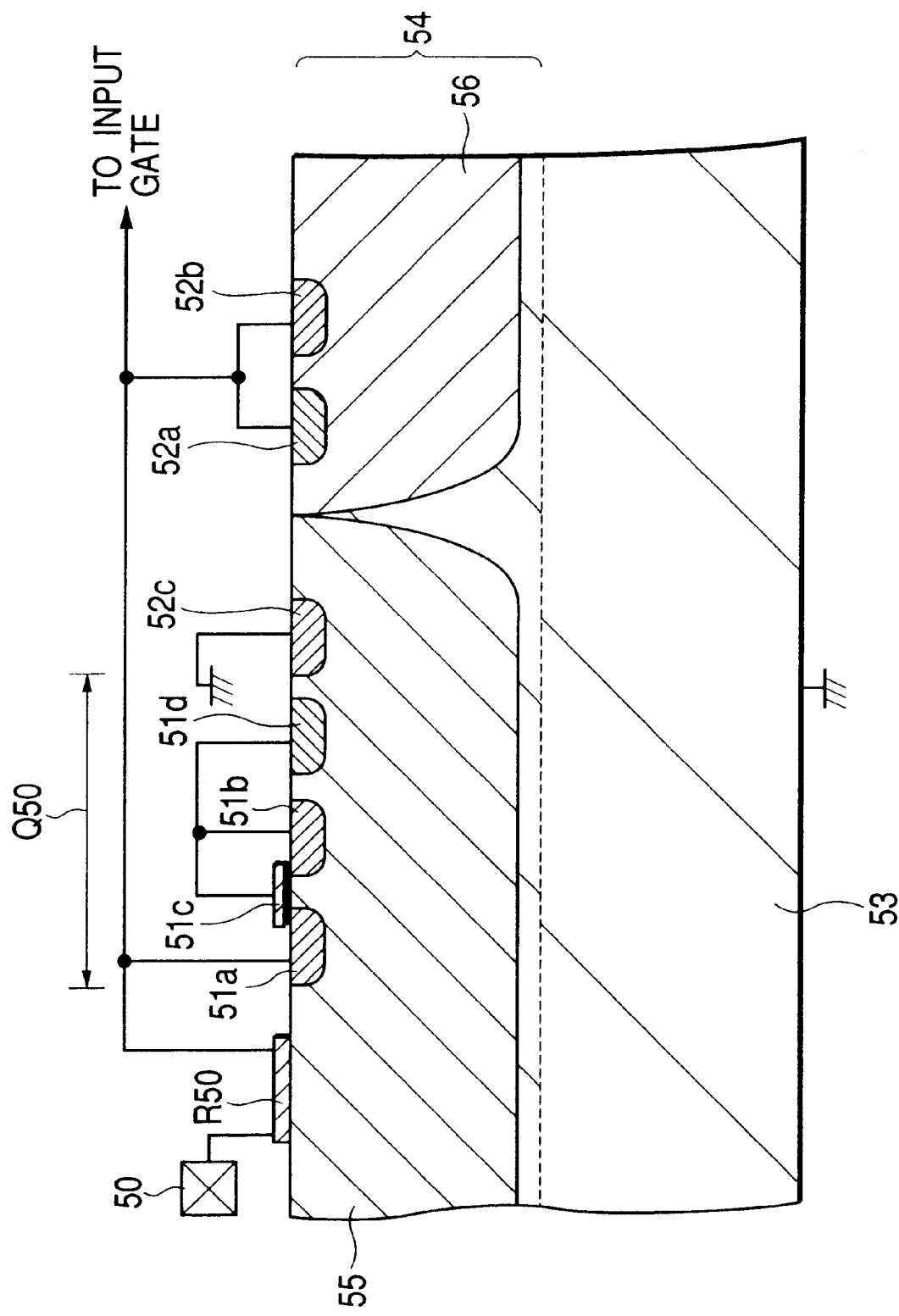
FIG. 2 is a cross-sectional view of a semiconductor substrate showing the device structure of the circuit shown in FIG. 1.

FIG. 2 is a cross-sectional view showing a device structure of the circuit shown in FIG. 1. A low-concentration p-type epitaxial layer 54 is formed on the surface of a high-concentration p-type substrate 53. A p-type well 55 and an n-type well 56 tire formed in the low-concentration p-type epitaxial layer 54.

An $n^+$-type diffusion or diffused layer, which constitutes the drain terminal 51a and the source terminal 51b of the protective MOS Q50, a $p^+$-type diffusion or diffused layer, which constitutes the substrate terminal 51d of the protective MOS Q50, and an $n^+$-type diffusion or diffused layer, which constitutes the emitter terminal 52c of the parasitic NPN bipolar transistor Qth52, are formed in one p-type well 55. The substrate terminal 51d also serves as a base terminal of the parasitic NPN bipolar transistor Qth52, i.e., the trigger electrode portion of the parasitic PNPN thyristor. Further, the emitter terminal 52c is electrically connected to the ground terminal. The equivalent p substrate resistor Rth52 is substantially a diffused resistor or resistance parasitically formed in the p-type well 55 lying between the substrate terminal 51d and the emitter terminal 52c.

A $p^+$-type diffusion or diffused layer, which constitutes the emitter terminal 52a of the parasitic PNP bipolar transistor Qth51, and an $n^+$-type diffusion or diffused layer, which constitutes the potential supply portion 52b for supplying a predetermined potential to the n-type well 56, are formed in the other n-type well 56. The equivalent n well resistor Rth51 is substantially a diffused resistor or resistance parasitically formed in the n-type well 56.

In the inventor-discussed circuit arrangement, a punch through current basically flows between the drain terminal 51a and the source terminal 51b due to drain-source breakdown of the protective MOS Q50 when a positive surge voltage is applied to the input terminal 50. This current results in a trigger current which flows in the parasitic PNPN thyristor TH50. However, the present circuit substantially has a factor that the punch through current flows in the ground terminal through the equivalent p substrate resistor Rth52 (diffused resistor or resistance of p-type well 55) in addition to the trigger current, so that the potential applied to the base of the parasitic NPN bipolar transistor Qth52 increases due to a voltage drop developed across the equivalent p substrate resistor Rth52, thereby driving the parasitic NPN bipolar transistor Qth52. Namely, in the present technology, a voltage (corresponding to a forward blocking voltage [hereinafter called simply "block voltage"]) at which the parasitic PNPN thyristor TH50 is driven, results in the sum of a breakdown voltage of the protective MOS Q50 and a voltage applied to the base of the parasitic NPN bipolar transistor Qth52, based on the voltage drop developed across the equivalent p substrate resistor Rth52.

However, the inventor-discussed technology has the following problems, for example. Firstly, the present technology has a problem in that the turn-on time for the parasitic PNPN thyristor TH50 is delayed. This is because, when the surge voltage is applied to the input terminal 50, the voltage drop developed across the equivalent p substrate resistor Rth52 is over a base-to-emitter voltage of the parasitic NPN bipolar transistor Qth52 owing to a current which began to flow due to the drain-source breakdown of the protective MOS Q50, whereby the parasitic PNPN thyristor TH50 is driven for the first time.

Secondly, the inventor-discussed technology has a problem in that the device design of the protection circuit is difficult. Since the equivalent p substrate resistor Rth52 is affected by a sensitivity characteristic of the parasitic PNPN thyristor TH50, it is necessary to form the equivalent p substrate resistor Rth52 so that its sensitivity characteristic is brought to a suitable value. Since, however, the p-type well 55 in which the equivalent p substrate resistor Rth52 is formed, varies in its vertical structure (e.g., size, impurity distribution) for each process, it is difficult to form the equivalent p substrate resistor Rth52 in such a manner that the sensitivity characteristic of the parasitic PNPN thyristor TH50 is brought to a suitable value.

Thirdly, the present technology has a problem in that it is difficult to cope with miniaturization or scale down of each element in the internal circuit. Since the breakdown voltage of the protective circuit protects each element in the internal circuit, it is necessary for the breakdown voltage thereof to be lower than the gate withstand voltage of the internal circuit. In the inventor-discussed technology, however, since the drain-source breakdown current of the protective MOS Q50 begins to flow only when the surge voltage applied to the input terminal 50 exceeds the sum of the drain-source breakdown voltage of the protective MOS field effect transistor and the base voltage of the parasitic NPN bipolar transistor Qth52, it is difficult to set the breakdown voltage of the protection circuit lower than the withstand voltage of a gate insulator for each element in the internal circuit according to the scale down of each element in the internal circuit.

Fourthly, the inventor-discussed technology has a problem in that, when a so-called SOI (Silicon On Insulator) substrate is used wherein an element forming semiconductor layer is provided on an insulating layer, it is difficult for a current produced clue to static electricity or the like to escape, whereby the protection circuit needs to have a high discharge capability. Since complete element separation is allowed when the SOI substrate is used, the wiring-to-substrate parasitic capacitance, the diffusion capacitance, etc. can be reduced and the operating speed of a semiconductor device can be increased. This substrate is suitable for a semiconductor device having a high-frequency signal circuit. However, a problem arises in that, while complete element separation is allowed, it is hard for current produced due to static electricity or the like to escape, and element breakdown also will easily take place. Therefore, the protective circuit needs to have a high discharge capability in a semiconductor device using a SOI substrate.

A semiconductor device according to the first embodiment will next be described. In the semiconductor device according to the first embodiment, a SOI substrate is used as the semiconductor substrate. A principal part of a protection circuit for protecting an internal circuit of the semiconductor device from an overvoltage or overcurrent developed due to static electricity or the like comprises a thyristor protective element having a thyristor and a trigger element for driving the thyristor. The thyristor and the trigger element are formed in the same semiconductor layer portion surrounded by complete separation portions.

One example of a protection circuit employed in the semiconductor device according to the first embodiment will be explained with reference to FIGS. 3 through 5. Incidentally, broken lines in FIG. 3 typically show the above-described complete separation portions. As to the protection circuit, the broken lines typically indicate that elements surrounded by the broken lines are provided in the same semiconductor layer portion. An arrow shown in FIG. 4(a) indicates a path for discharging a negative overcurrent, and an arrow shown in FIG. 4(b) indicates a path for discharging a positive overcurrent.

Figure 3:
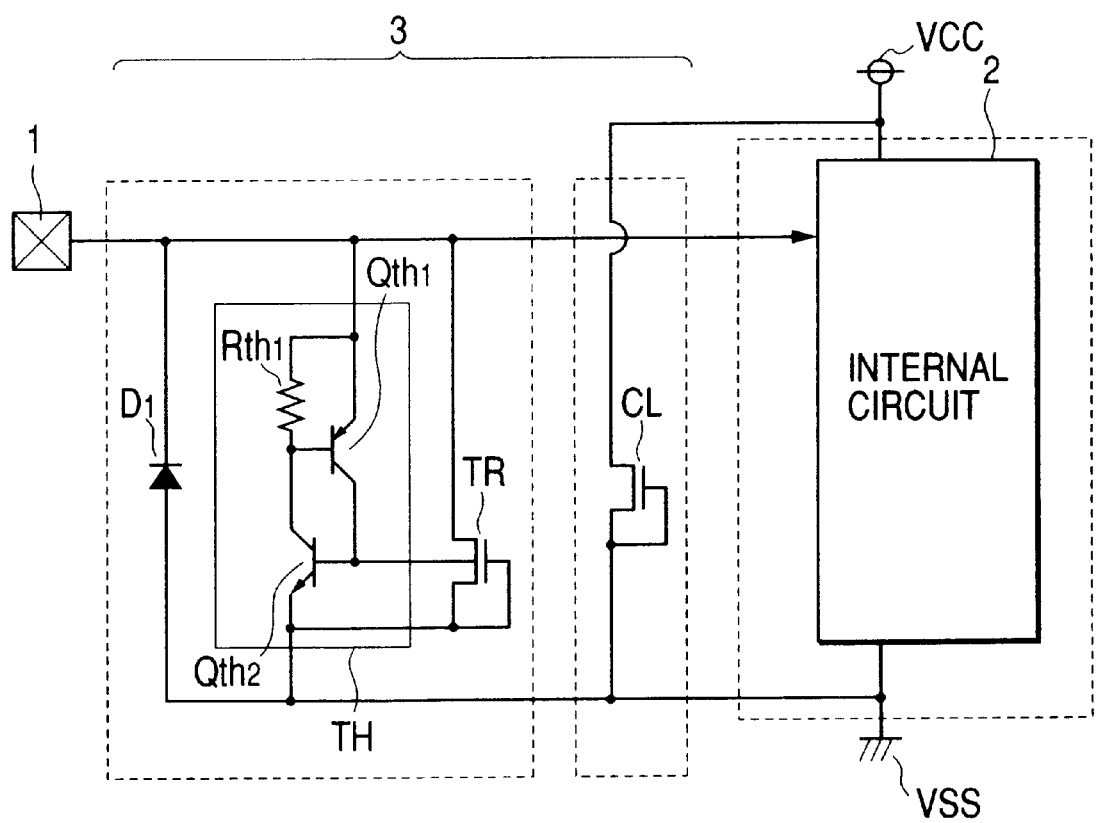
FIG. 3 is a fragmentary circuit diagram of a semiconductor device showing one embodiment of the present invention.
Figure 4A:
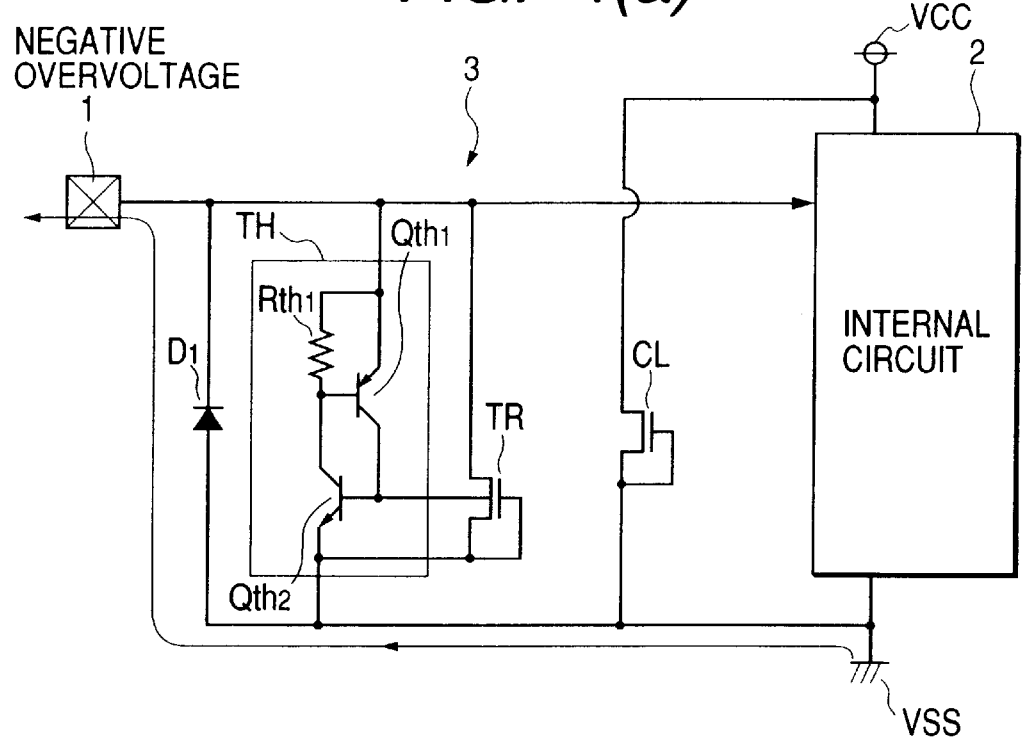
FIG. 4(a) is a circuit diagram typically showing a discharge path for negative overcurrent which flows in a protection circuit of the semiconductor device shown in FIG. 3.

As shown in FIG. 3, an external terminal I is a terminal for drawing.out an electrode of an internal circuit 2. This is also generally called a "bonding pad", which is placed in the vicinity of the outer periphery of a main surface of a semiconductor chip or in the center of the main surface as viewed on a plane basis, and is formed in the top wiring layer as viewed in cross-section. The external terminal 1 indicates a terminal for a signal and is electrically connected to a main circuit portion through a peripheral circuit portion lying within the internal circuit 2. The present peripheral circuit portion is an interface circuit portion for performing the matching of an electrical level with the inside and outside of the semiconductor device and control on timing as in the case of, for example, an input circuit, an output circuit or an input/output bidirectional circuit or the like. The main circuit portion is a principal circuit portion for determining the function of the semiconductor device. In the present embodiment, a high-frequency signal circuit like, for example, an LNA (Low Noise Amplifier), a MIXER or the like is formed in the main circuit portion. Incidentally, a high-frequency signal is referred to as a signal of 1 GHz or more, for example, in the present embodiment.

This type of internal circuit 2 is electrically connected between a source or power terminal VCC on the relatively high-potential side and a power terminal VSS on the relatively low-potential side. The power terminal VCC on the high-potential side is a terminal for supplying a relatively high voltage to drive the semiconductor device. The terminal is set to a voltage range of, specifically, e.g., about 1.8V to about 3.3V. The power terminal VSS on the low-potential side is a terminal for supplying a reference potential for the semiconductor device. In general, the terminal is also called a "ground terminal or GND terminal", which is set to, specifically, e.g., OV or another potential. Incidentally, as to the supply of the potentials to these power terminals VSS on the low-potential side and VSS on the high-potential side, the potential might be supplied directly from the external terminal 1. At all other times, the potential might be supplied from an internal power supply lying within the internal circuit 2.

The protection circuit 3 employed in the present embodiment is electrically connected between a wiring for the external terminal 1 and the internal circuit 2 and the power terminal VSS on the low-potential side. The protection circuit 3 is a circuit for protecting the internal circuit 2 of the semiconductor device from an overvoltage or overcurrent developed due to static electricity or the like. The circuit includes, for example, a diode D1, a parasitic PNPN thyristor TH, a trigger element TR and a clamp element CL. Of these, the diode D1, parasitic PNPN thyristor TH and trigger element TR are formed in the same semiconductor layer portion surrounded by the complete separation portions.

The diode D1 is a protective element activated when a negative voltage is applied to the external terminal 1 to thereby allow an electrical charge to escape. The diode D1 is electrically connected between the external terminal 1 and the power terminal VSS on the low-potential side in such a manner that the direction of the connection therebetween is taken in the forward direction. Owing to the provision of such a diode D1, the overcurrent can be allowed to escape from the power terminal VSS on the low-potential side to the external terminal 1 through the diode D1, as shown in FIG. 4(a), when a negative overvoltage, as viewed from the power terminal VSS on the low-potential side, is applied to the external terminal 1. It is therefore possible to improve the electrostatic breakdown resistance to a negative overvoltage. While the diode D1 is formed of, for example, pn-junction diode herein, it is not limited to this diode. The diode D1 also may be formed of a diode-connected MOS, for example. Since the pn-junction diode and the diode-connected MOS can respectively be formed in a small area, the protection circuit 3 can be formed without a substantial increase in layout area.

On the other hand, the thyristor protective element is a protective element that is activated when a positive voltage is applied to the external terminal 1 to thereby cause an electrical charge to escape. The thyristor protective element has a parasitic PNPN thyristor TH and a trigger element TR. The parasitic PNPN thyristor TH has first and second bipolar transistors Qth1 and Qth2, and a resistor Rth1. The first bipolar transistor Qth1 comprises a PNP-type bipolar transistor, and the second bipolar transistor Qth2 comprises an NPN-type bipolar transistor.

The emitter of the first bipolar transistor Qth1 is electrically connected to the external terminal 1. Further, the base of the first bipolar transistor Qth1 is electrically connected to its emitter and the external terminal 1 through the resistor Rth, and it is also electrically connected to the collector of the second bipolar transistor Qth2. Further, the collector of the first bipolar transistor Qth1 is electrically connected to the base of the second bipolar transistor Qth2. The base of the second bipolar transistor Qth2 serves as the gate, i.e., the trigger electrode portion of the parasitic PNPN thyristor TH. The emitter of the second bipolar transistor Qth2 is electrically connected to the power terminal VSS on the low-potential side.

In the first embodiment, a substrate electrode (back gate) of the trigger element TR is electrically connected to the base of the second bipolar transistor Qth2, which serves as the trigger electrode portion of the parasitic PNPN thyristor TH. The trigger element TR is an element which provides a trigger for driving the parasitic PNPN thyristor TH. The trigger element TR is formed of a diode-connected NMOS, for example. The drain of the trigger element TR is electrically connected to the external terminal 1 and the source thereof is electrically connected to the gate electrode and power terminal VSS on the low-potential side. However, the trigger element TR is not limited to the NMOS, and various changes can be made thereto. The trigger element TR can also be formed of, for example, a bipolar transistor. In this case, the base of the bipolar transistor for the trigger element is electrically connected to the base of the second bipolar transistor Qth2. Further, the collector of the bipolar transistor for the trigger element is electrically connected to the external terminal 1, and the emitter thereof is electrically connected to the power terminal VSS on the low-potential side.

Figure 4B:
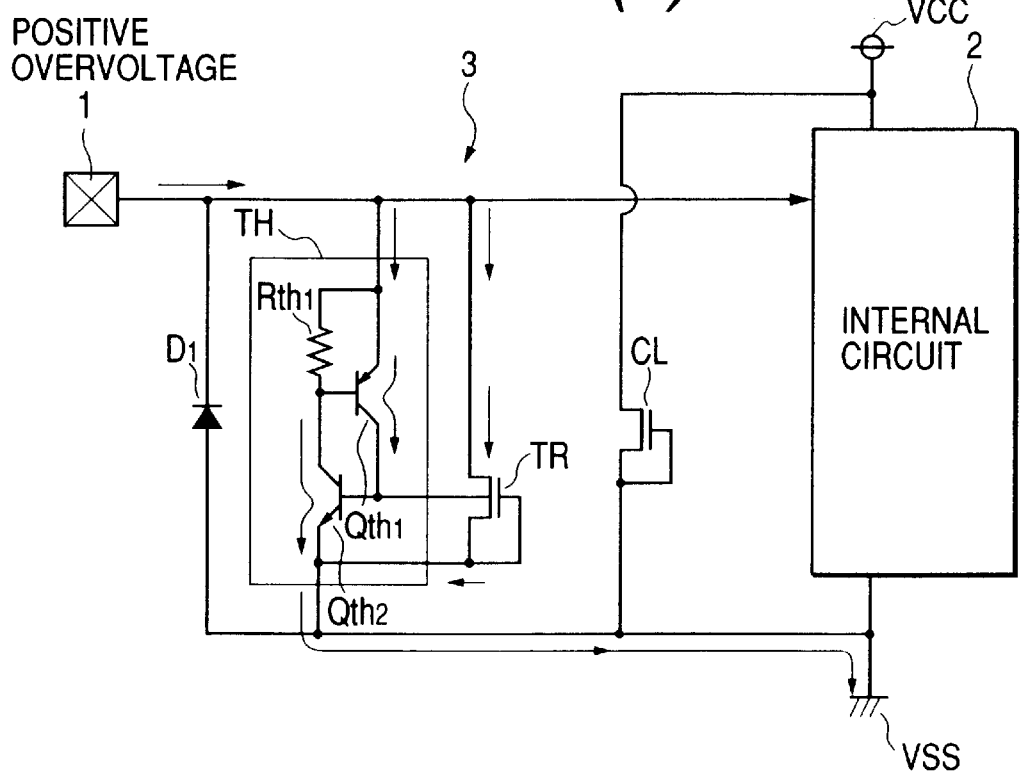
FIG. 4(b) is a circuit diagram typically illustrating a discharge path for positive overcurrent.

Owing to the provision of such a thyristor protective element, when a positive overvoltage is applied to the external terminal 1, as shown in FIG. 4(b), and the source-to-drain of the trigger element TR breaks down, the parasitic PNPN thyristor TH is turned on by a substrate current produced thereby. Thus, since an overcurrent is allowed to escape from the external terminal 1 to the power terminal VSS on the low-potential side through the parasitic PNPN thyristor TH and trigger element TR, the electrostatic breakdown resistance to a positive overvoltage can be improved.

In the first embodiment in particular, the substrate electrode of the trigger element TR is electrically connected to the trigger element (the base of the second bipolar transistor Qth2) of the parasitic PNPN thyristor TH (the base of the second bipolar transistor Qth2 and the substrate electrode of the trigger element TR are integrally formed in the same semiconductor region as will be described later), whereby the parasitic PNPN thyristor TH can be turned on at high speed. This is because, while the substrate current developed due to the source-to-drain breakdown of the trigger element TR serves as the trigger current for the parasitic PNPN thyristor TH when the positive overvoltage is applied to the external terminal 1, the substrate current is efficiently injected into the trigger electrode portion of the parasitic PNPN thyristor TH because no flow channel exists except when it is injected into the trigger electrode (the base of the second bipolar transistor Qth2) of the parasitic PNPN thyristor TH. Accordingly, the first embodiment can be provided with a protection circuit 3 which exhibits satisfactory electrostatic breakdown resistance that is supersensitive even to a positive overvoltage. Since the availability of the trigger current can be rendered high, the trigger element TR itself can be reduced in size (occupied area). It is therefore possible to reduce the size of a semiconductor chip. Thus, the yield of the semiconductor device can be enhanced and the manufacturing cost can also be reduced. Since the protection circuit 3 (parasitic PNPN thyristor TH and trigger element TR in particular) can be reduced in size, the parasitic capacitance can be rendered small. Thus, a semiconductor device having a high-frequency signal circuit is capable of having an improved electrostatic breakdown resistance without a deterioration in electrical characteristic.

Figure 5:
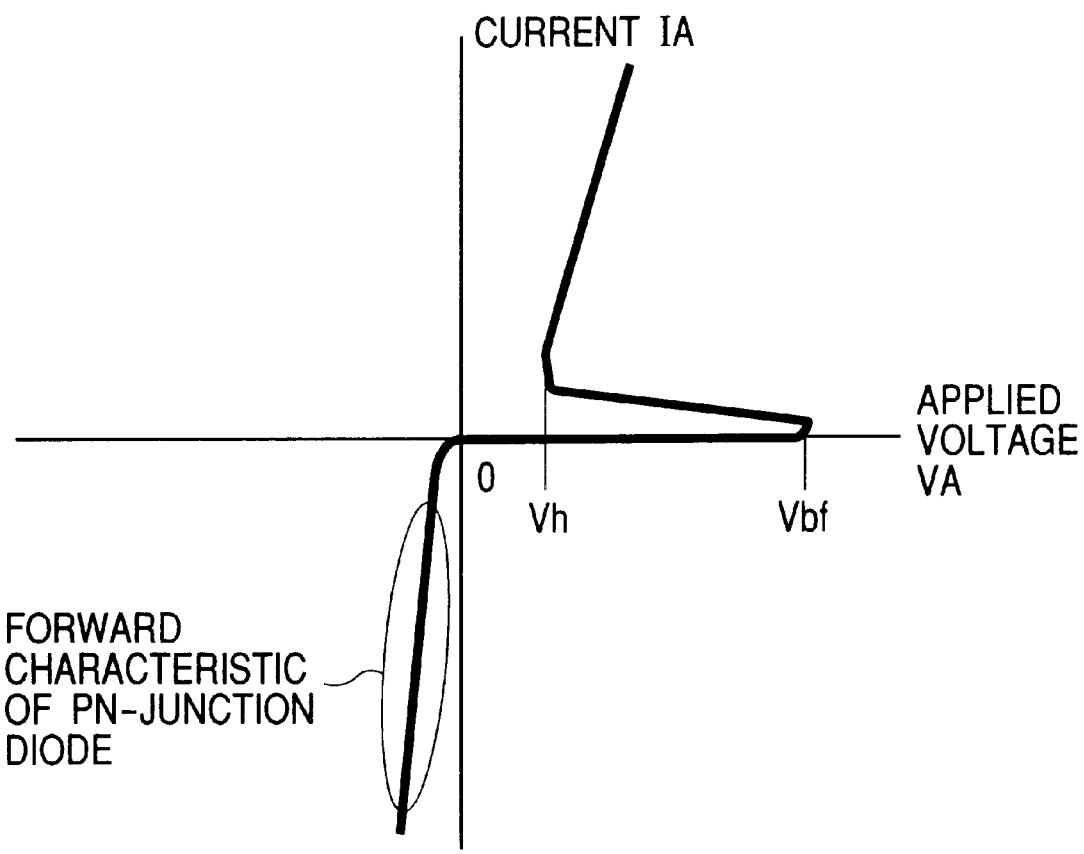
FIG. 5 is a graph showing a typical current vs. voltage characteristic illustrative of a hold voltage of the protection circuit shown in FIG. 3.

Now, FIG. 5 shows a typical current IA-voltage VA characteristic indicative of a hold voltage of a parasitic PNPN thyristor TH. Vh indicates a hold voltage of the parasitic PNPN thyristor TH, and Vbf indicates the block voltage (operation start voltage of the parasitic PNPN thyristor TH) of the protective element (parasitic PNPN thyristor TH).

In the first embodiment, the substrate current, which is developed when an overvoltage is applied to the external terminal 1 and the voltage applied to the external terminal 1 has reached the source-to-drain breakdown voltage BVDS of the trigger element TR (illustrated by the NMOS by way of example), is injected to the gate (trigger electrode portion) of the parasitic PNPN thyristor TH. Therefore, the block voltage Vbf of the thyristor protective element becomes equal to the source-to-drain breakdown voltage BVDS. Thus, in the present embodiment, the block voltage Vbf can be reduced by the base-emitter voltage VBE (e.g., about 0.8V) as compared with the inventor-discussed technology (Vbf=BVDS+VBE).

Therefore, the block voltage Vbf can be set to be smaller with respect to the gate withstand voltage of the MOS constituting an internal circuit 2, whereby excellent electrostatic breakdown resistance can be obtained. The gate insulator of the MOS constituting the internal circuit 2 tends toward to be made thinner in response to a request for improvement in performance or the like. Thus, since the gate withstand voltage also becomes low, the block voltage is also inevitably set low according to this lowering. Since the block voltage Vbf can be reduced in the present embodiment, the present embodiment can cope even with the scale down (thinning of gate insulator) of the MOS for such an internal circuit 2. Since a restriction on each element in the internal circuit can be relaxed in reverse as viewed from the protection circuit side, the scale down of each element in the internal circuit 2 can be accomplished. It is thus possible to increase the operating speed of the semiconductor device.

The clamp element CL shown in FIG. 3 is formed of, for example, an nMOS diode-connected between the power terminal VCC on the high-potential side of the internal circuit 2 and the power terminal VSS on the low-potential side. Owing to the provision of such a clamp element CL, a discharge path can be formed at the time that an overvoltage is applied between the power terminals VCC and VSS of the internal circuit 3. Thus, the electrostatic breakdown resistance can be improved.

Such a protection circuit 3 may be provided with respect to all the input circuits or output circuits of the semiconductor device, for example. Alternatively, the protection circuit 3 may be provided with respect to a specific input circuit or output circuit. Further, the protection circuit 3 may be provided with respect to both peripheral circuits of the input and output circuits.

Examples in which the protection circuit 3 is provided with respect to input circuits are shown in FIGS. 6(a), 6(b), 7(a) and 7(b). Incidentally, the broken lines shown in FIGS. 6(a) to 7(b) have the same meaning as in FIG. 3. Commonly available input circuits for a semiconductor device are shown herein.

Figure 6A:
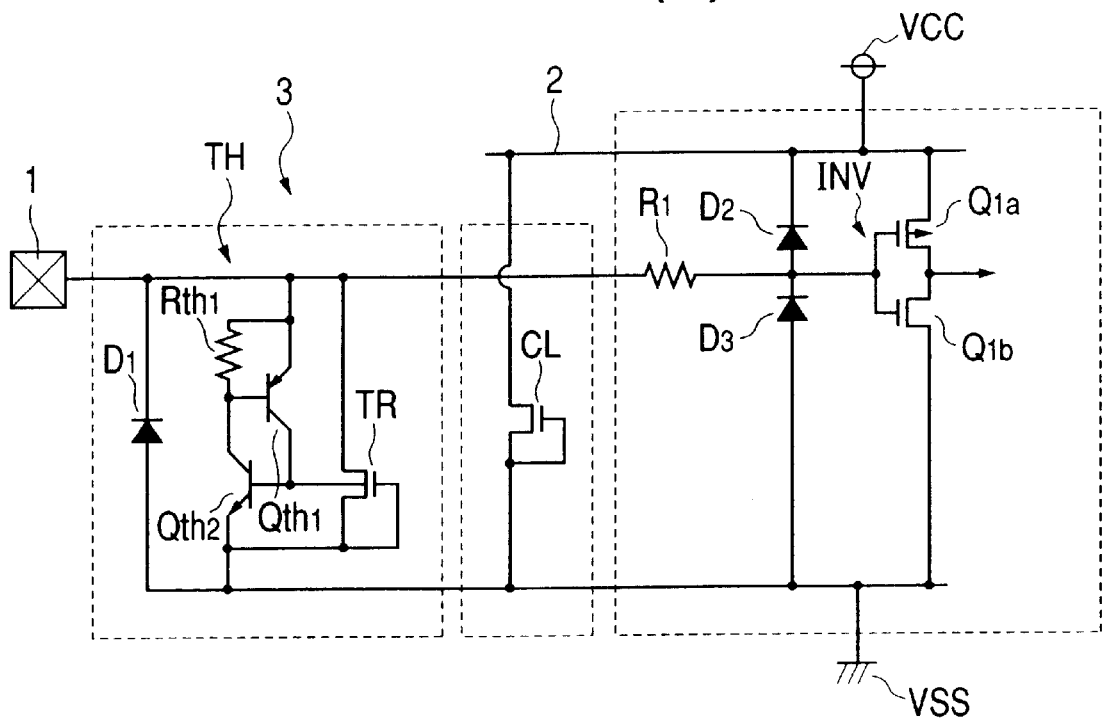
FIGS. 6(a) and 6(b) are circuit diagrams showing examples of input circuits employed in the semiconductor device shown it FIG. 3.
Figure 6B:
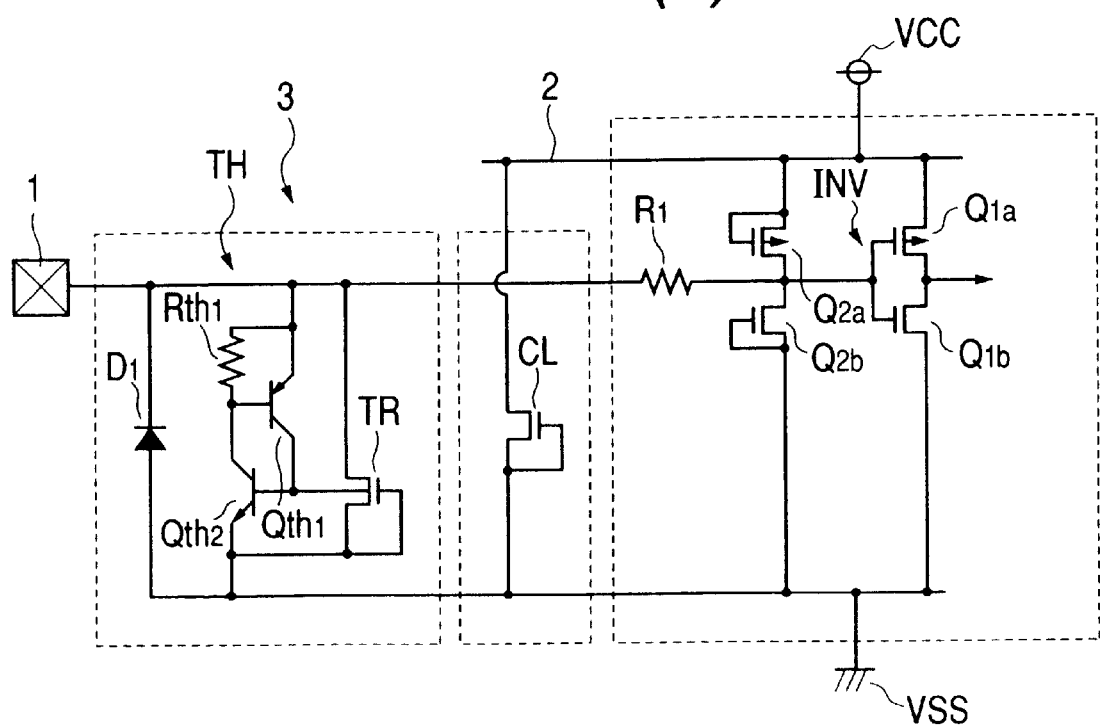

FIGS. 6(a) and 6(b) respectively show, as examples, cases in which input circuits comprise CMOS (Complementary MOS) inverter circuits INV. Each of the CMOS inverter circuits INV is configured so that a PMOS Q1a and an NMOS Q1b are series-connected between source or power terminals VCC and VSS. The output of the CMOS inverter circuit INV is electrically connected to the principal circuit portion of the semiconductor device, and the input thereof is electrically connected to the external terminal 1 through an input protection resistor R1. In FIG. 6(a), protection diodes D2 and D3 are electrically connected between the input protection resistor R1 and the input of the CMOS inverter circuit INV. In FIG. 6(b), diode-connected protection PMOS Q2a and NMOS Q2b are electrically connected between the input protection resistor R1 and the input of the CMOS inverter circuit INV in place of the diodes D2 and D3.

The input protection resistor R1 has the function of restraining or preventing the flow of an overcurrent in the CMOS inverter circuit INV and increasing the impedance as viewed from the external terminal 1 side to thereby make it easy to cause an electrical charge on the wiring or the like on the input side of the CMOS inverter circuit INV to escape toward the external terminal side through the diodes D2 and D3 and a power supply wiring.

The protection diodes D2 and D3 shown in FIG. 6(a) are electrically connected between a gate electrode corresponding to the input of the CMOS inverter circuit INV and the power terminal VCC and between the gate electrode corresponding to the input thereof and the power terminal VSS so that they are connected in a backward direction. The protection diodes D2 and D3, when the external terminal 1 is grounded, have the function of discharging an electrical charge inside the semiconductor device upon execution of an electrostatic breakdown test or the like by, for example, a CD (Charged Device) method, thereby preventing the occurrence of a difference between a potential applied to an input wiring (including a metal wiring and the gate electrode on the input side) of the CMOS inverter circuit INV and a potential applied to a well on the semiconductor substrate side at which the MOS Q1a and MOS Q1b of the CMOS inverter circuit INV are placed, or a semiconductor region (diffused layer) for the source/drain of the MOS Q1a and MOS Q1b thereof.

Namely, in the present embodiment, the connection of the input protection resistor R1 and diodes D2 and D3 to the input stage of the CMOS inverter circuit INV makes it possible to rapidly discharge an electrical charge on the output wiring side of the CMOS inverter circuit INV to the external input wiring side through the diodes D2 and D3 when the external terminal 1 is grounded. Thus, since the difference between the time required to discharge the electrical charge on the input wiring side of the CMOS inverter circuit INV and the time required to discharge the electrical charge on the output side can be shortened, a high voltage can be prevented from being momentarily applied to gate insulators of the MOS Q1a and MOS Q1b of the CMOS inverter circuit INV due to the difference in discharge time. Therefore, gate dielectric breakdown can be prevented from occurring and the yield and reliability of the semiconductor device can be enhanced. Incidentally, the diodes D2 and D3 are placed within a well different from the one used for the diode D1 of the protection circuit 3 on the semiconductor substrate, as will be described later.

The protection PMOS Q2a and NMOS Q2b shown in FIG. 6(b) also function in a manner similar to the diodes D2 and D3, respectively. The protection PMOS Q2a and NMOS Q2b are respectively diode-connected between a gate electrode corresponding to the input of the CMOS inverter circuit INV and a source or power terminal VCC and between the gate electrode corresponding to the input thereof and a source or power terminal VSS so that they are connected in the backward direction. Since, in this case, the MOS can reduce the breakdown voltage by about 1V as compared with the diodes, a structure which can easily execute the discharging of the electrical charge is achieved. Thus, the electrical charge can be quickly discharged. Further, bipolar transistors may be diode-connected in place of the diodes D2 and D3. Since, in this case, the bipolar transistors are higher than the diodes in drive capability, the electrical charge can promptly be discharged.

The power terminal VSS on the low-potential side, of the above-described protection circuit 3, and the input protection resistors R1, diodes D2 and D3, PMOS Q2a, NMOS Q2b, and the power terminals VSS on the low-potential side, of the CMOS inverter circuits INV shown in FIGS. 6(a) and 6(b) are configured in common, but they may be configured separately. In that case, the potentials at the power terminals VSS may be equal to or different from each other. Thus, the individual separation of the power terminals VSS makes it possible to prevent a variation in the potential of a source or power supply for the other circuit due to a potential variation developed on the one circuit side.

Figure 7A:
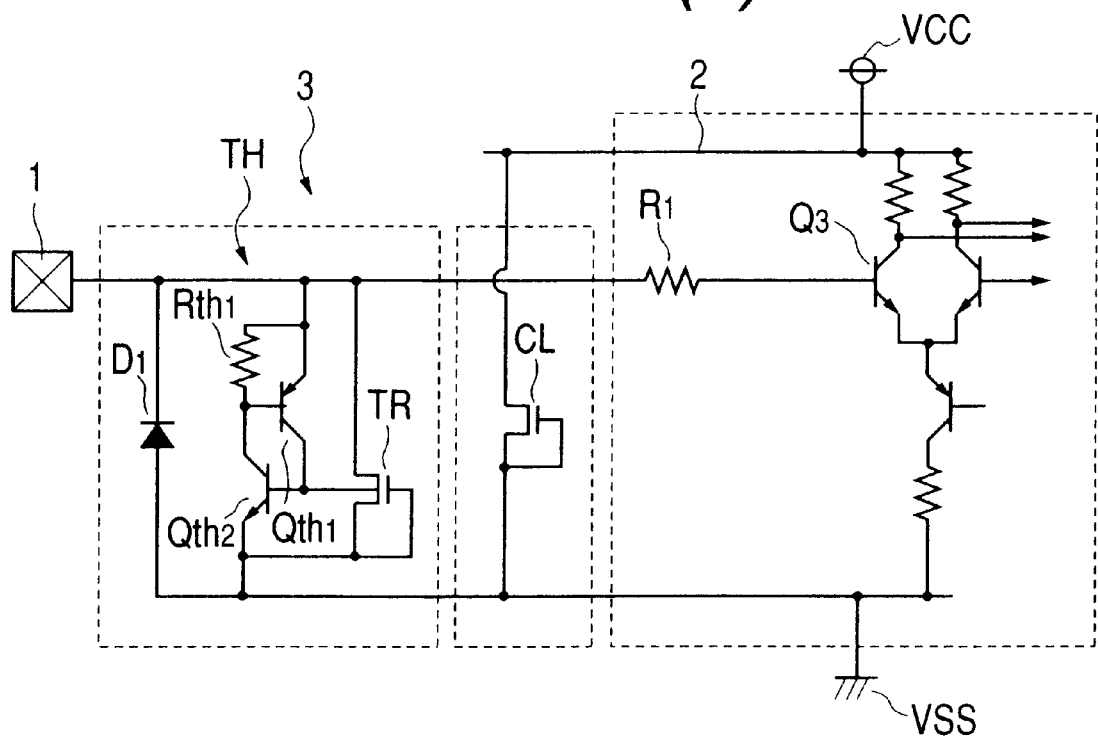
FIGS. 7(a) and 7(b) are circuit diagrams illustrating other examples of input circuits employed in the semiconductor device shown in FIG. 3.
Figure 7B:
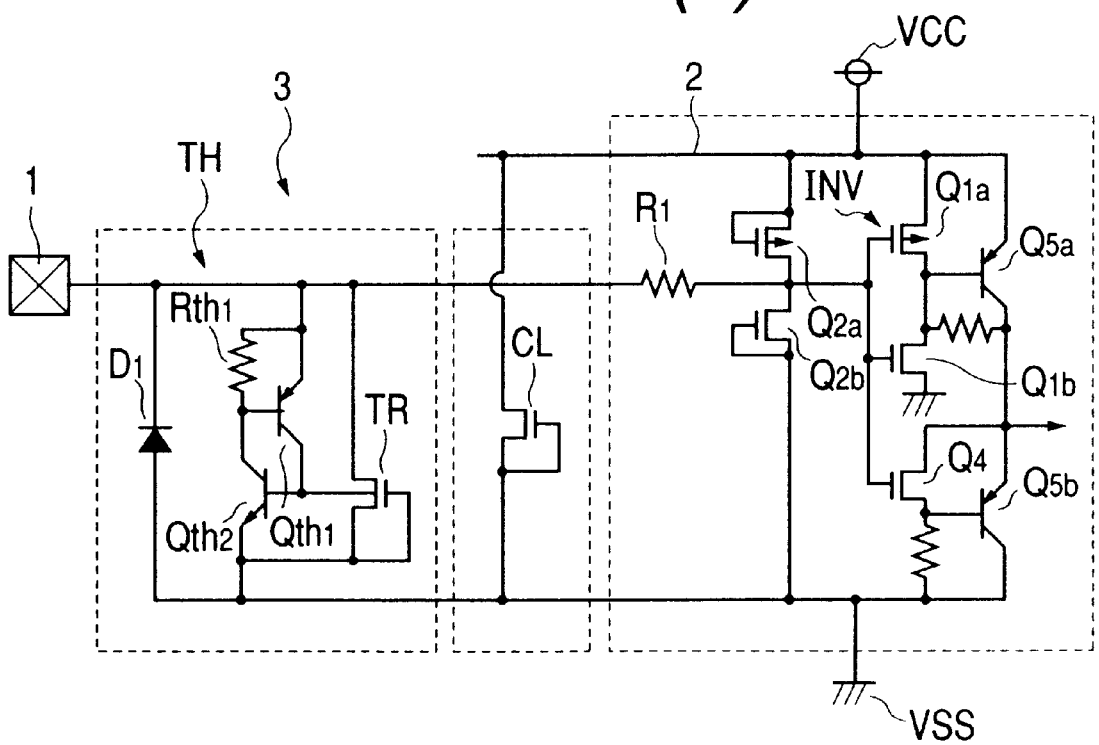

On the other hand, FIGS. 7(a) and 7(b) respectively show, as examples, cases in which bipolar transistors are used in input circuits. In FIG. 7(a), an external terminal 1 is electrically connected to the base of a bipolar transistor Q3 through an input protection resistor R1. The output (collector) of the bipolar transistor Q3 is electrically connected to a principal circuit portion of an internal circuit 2.

FIG. 7(b) shows, as an example, the case in which a BiCMOS (Bipolar CMOS) circuit is formed in the input circuit. The BICMOS circuit is a circuit which utilizes both the advantage of the load drive capabilities of bipolar transistors and the advantage of the low-power characteristics of a CMOS in combination. The BiCMOS circuit includes, for example, a PMOS Q1a and an nMOS Q1b, which constitute a CMOS inverter circuit INV, an NMOS Q4, and two bipolar transistors Q5a and Q5b series-connected between power terminals VCC and VSS. In the present example, the external terminal 1 is electrically connected to the input of the CMOS inverter circuit INV and the input of the NMOS Q4 through the input protection resistor R1. The output of the CMOS inverter circuit INV is electrically connected to the base of the bipolar transistor Q5a. Further, the drain of the NMOS Q4 is electrically connected to a portion where the emitter of the bipolar transistor Q5a and the collector of the bipolar transistor Q5b are connected. The source of the NMOS Q4 is electrically connected to the base of the bipolar transistor Q5b. The output of such a BiCMOS circuit is electrically connected to the principal circuit portion of the internal circuit 2.

Meanwhile, FIGS. 6(a), 6(b) and 7(a) and 7(b) have shown, as examples, cases in which the commonly available input circuits for the semiconductor circuit are shown and the input protection circuits R1, etc. are provided at the stages prior to the input terminals of the input circuits, respectively. However, when the internal circuit 2 is a high-frequency signal circuit, the input protection resistor R1 may preferably be detached, from the viewpoint of acquisition of a satisfactory high-frequency characteristic. Since the overcurrent produced due to the positive/negative overvoltage can promptly be removed by the protection circuit 3 in the first embodiment, each element lying in the internal circuit 2 can sufficiently be protected even in the case of a device free of the input protection resistor R1, etc., as in a high-frequency signal circuit or the like.

Figure 8:
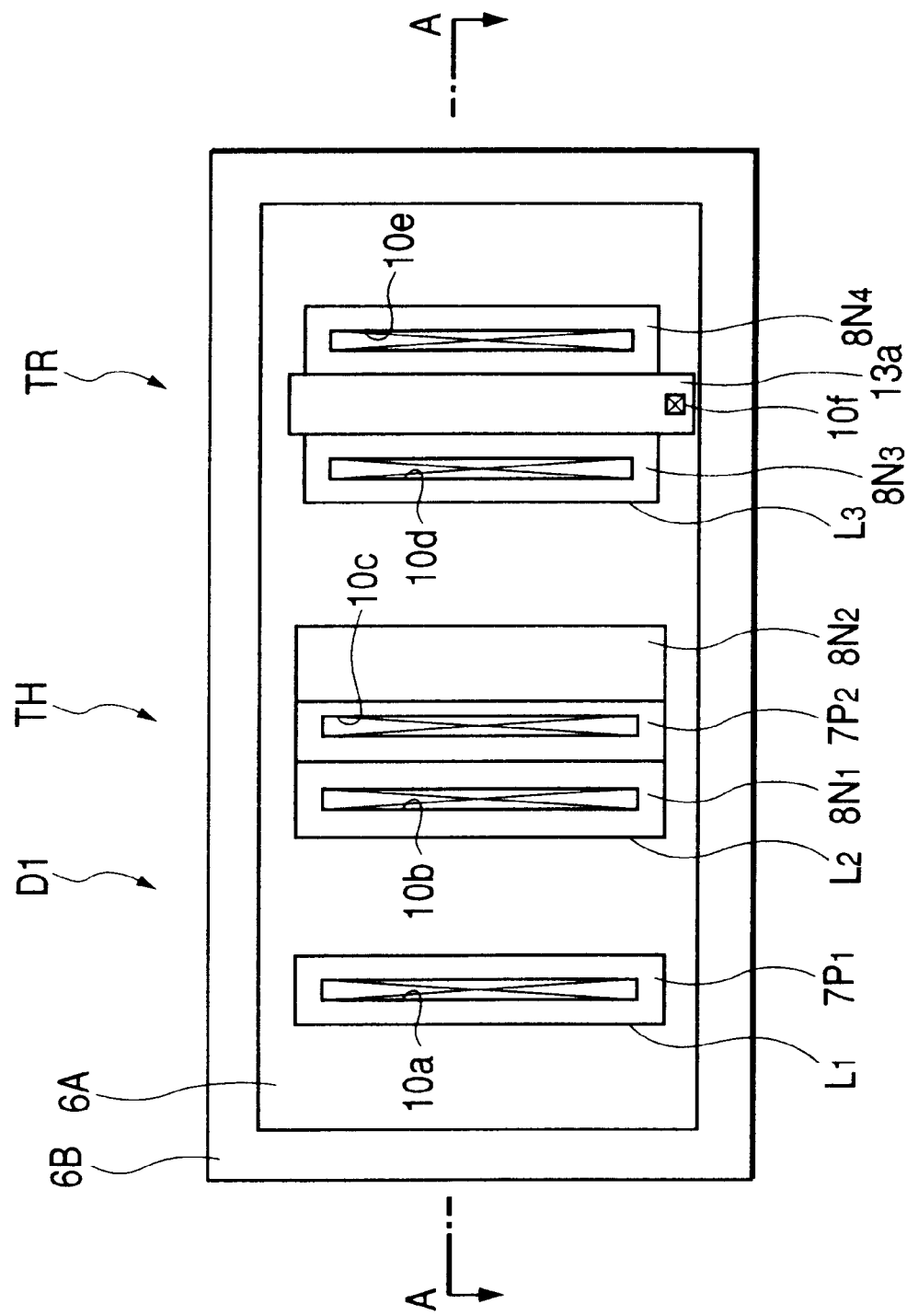
FIG. 8 is a fragmentary plan view of a semiconductor substrate illustrative of a device structure of the protection circuit of the semiconductor device shown in FIG. 3.
Figure 9:
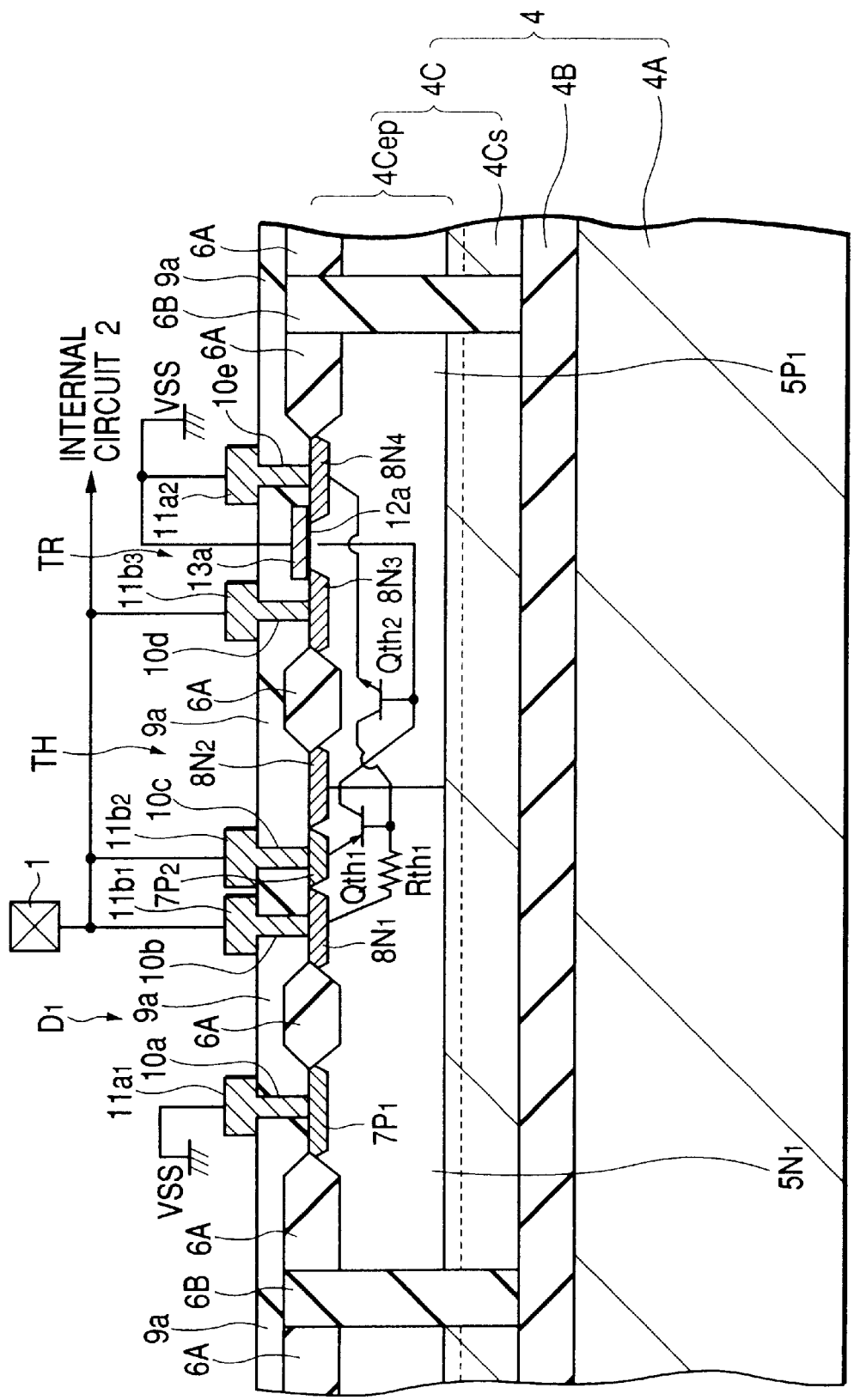
FIG. 9 is a cross-sectional view taken along line A—A of FIG. 8.

The device structure of the protection circuit 3 employed in the semiconductor device according to the first embodiment will next be described with reference to FIGS. 8 and 9. Incidentally, FIG. 8 is a typical plan view showing a diode D1, a parasitic PNPN thyristor TH and a trigger element TR1 of the protection circuit 3, and FIG. 9 is a typical cross-sectional view taken along line A—A of FIG. 8, respectively.

The SOI substrate 4 is used as the semiconductor substrate, as described above. The use of the SOI substrate 4 makes it possible to attain an increase in the operating speed of the semiconductor device, a reduction in the power consumption, and an improvement in the high-frequency characteristic. The SOI substrate 4 is configured in such a manner that a semiconductor layer 4C is formed on a support substrate 4A with a buried insulating layer 4B interposed therebetween. The support substrate 4A comprises, for example, a p-type silicon single crystal and has the function of principally ensuring the mechanical strength of the SOI substrate 4. The buried insulating layer 4B comprises, for example, a silicon oxide ($SiO_2$) film whose thickness is about 0.5 $\mu$m, for example. The semiconductor layer 4C is a layer on which elements are formed. The semiconductor layer 4C is formed principally of, for example, a p-type silicon single crystal and has a thickness which ranges from about 1 $\mu$m to about 3 $\mu$m, for example. FIG. 9 shows, as an example, the case in which an epitaxial layer 4Cep is formed over the semiconductor substrate layer 4Cs. Owing to the provision of the epitaxial layer 4Cep, the gate insulator of the MOS, for example, can be improved in quality and thinned. It is also possible to satisfactorily set the distance between the emitter and collector (buried collector layer) of each bipolar transistor.

An n well (first semiconductor region) SN1 and a p well (second semiconductor region) SP1 are formed in the semiconductor layer 4C. For example, phosphor or arsenic is introduced into the n well SN1. Although the invention is not so restricted in particular, its impurity concentration is about $10^{16}/cm^3$, for example. Further, for example, boron is introduced into the p well 5P1 adjacent to the n well 5N1. Although the invention is not so restricted in particular, its impurity concentration is about $5 \times 10^{15}/cm^3$, for example. In FIG. 9, the n well 5N1 and p well 5P1 are not hatched so as to make it easy to see the elements in the drawing.

A separator 6A comprised of silicon oxide, for example, is formed on a main or principal surface of the semiconductor layer 4C. The separator 6A is formed by, for example, a LOCOS (Local Oxidization of Silicon) method or the like. The bottom of the separator 6A does not reach the buried insulating layer 4B. Element forming active regions L1 through L3 are defined by the separators 6A. Incidentally, the separator 6A is not limited to one formed by the LOCOS method. It may be provided as a so-called trench-type separator (trench isolation) formed by, for example, digging trenches in the semiconductor layer 4C and embedding an insulating film or the like into the trenches.

In the first embodiment, trenches, which reach the buried insulating layer 4B through the semiconductor layer 4C, are dug from the upper surface of the separator 6A. An insulating film comprised of, for example, silicon oxide or the like is embedded into the trenches to thereby form a complete separator 6B. Namely, the semiconductor layer 4C, which is surrounded by the separator 6B and the buried insulating layer 4B, is perfectly insulated and separated from another semiconductor layer 4C. In the present embodiment, the separator 6B is shaped in the form of a planar frame, as shown in FIG. 8. The diode D1, parasitic PNPN thyristor TH and trigger element TR of the protection circuit 3 are formed in the semiconductor layer 4C portion lying within the frame. Namely, the diode D1, parasitic PNPN thyristor TH, trigger TR, n well 5N1 and p well SP1 are formed within the same semiconductor layer 4C surrounded by the complete separator 6B and the buried insulating layer 4B. Incidentally, the size of a protective element comprising the diode D1, the parasitic PNPN thyristor TH and the trigger TR is about $50 \times 50$ μm, for example, although the invention is not so restricted in particular.

Further, each of the individual portions are perfectly separated from one another even in the region for the internal circuit 2. Thus, since the amount of collected electrical charges is low, even if ionizing radiation like a radiation or the like is applied to the semiconductor layer 4C, the resistance to soft errors can be improved. Since a CMOS structure is capable of preventing a latch-up phenomenon, the interval between the adjacent pMOS and nMOS can be set to a minimum separation width. It is thus possible to implement high integration of the semiconductor device having the CMOS circuit. Incidentally, the complete separators 6B include ones by which the electrical separation between the adjacent elements is effected within a range allowed from the viewpoint of design.

The diode D1 comprises a pn-junction diode, for example, and has, as principal portions, the n well 5N1, and a $p^+$-type semiconductor region (eighth semiconductor region) 7P1 and an $n^+$-type semiconductor region (third semiconductor region) 8N1 formed over the n well 5N1. The $p^+$-type semiconductor region 7P1 contains boron corresponding to a p-type impurity, for example. The $n^+$-type semiconductor region 8N1 contains phosphor or As corresponding to an n-type impurity, for example. The type semiconductor region 7P1 and the $n^+$-type semiconductor region 8N1 are provided within the same n well 5N1. Thus, the value of the resistance between them can be lowered. Further, the $p^+$-type semiconductor region 7P1 and the $n^+$-type semiconductor region 8N1 are placed so that their mutual long sides extend in parallel on a plane basis. Thus, since it is possible to widely ensure a path or channel width of a current which flows between the $p^+$-type semiconductor region 7P1 and the $n^+$-type semiconductor region 8N1, the resistance value between them can be lowered. Since the resistance of the discharge path for the overcurrent produced due to a negative overvoltage can be reduced owing to these configurations, it is possible to allow the overcurrent to escape promptly.

Incidentally, the $p^+$-type semiconductor region 7P1 is electrically connected to its corresponding first layer wiring 11a1 through a contact hole 10a defined in an interlayer dielectric 9a over the SOI substrate 4. Further, the $p^+$-type semiconductor region 7P1 is electrically connected to a power or source terminal VSS on the low-potential side. On the other hand, the $n^+$-type semiconductor region 8N1 is electrically connected to its corresponding first layer wiring 11b1 through a contact hole 10b defined in the interlayer dielectric 9a and is electrically connected to an external terminal 1.

Further, a bipolar transistor Qth1, constituting the parasitic PNPN thyristor TH, includes, as principal portions, a $p^+$-type semiconductor region (fourth semiconductor region) 7P2, the n well 5N1, an $n^+$-type semiconductor region (fifth semiconductor region) 8N2, and the p well 5P1. The $p^+$-type semiconductor region 7P2 contains boron, for example, and is formed so as to extend in parallel adjacent to the $n^+$-type semiconductor region 8N1 within the region of the n well SN1.

Further, the $n^+$-type semiconductor region 8N2 contains phosphor or arsenic, for example, and is formed so as to extend in parallel adjacent to the $p^+$-type semiconductor region 7P2 so as to spread across both the n well SN1 and p well 5P1. Incidentally, the $p^+$-type semiconductor region 7P2 is electrically connected to its corresponding first layer wiring 11b2 through a contact hole 10c defined in the interlayer dielectric 9a and also is electrically connected to the external terminal 1. Further, a resistor Rth1 constituting the parasitic PNPN thyristor TH is equivalent to the resistance of the n well 5N1.

Further, a bipolar transistor Qth2, constituting the parasitic PNPN thyristor TH, has, as principal portions, the $n^+$-type semiconductor region 8N2, the n well 5N1, the p well 5P1, and an $n^+$-type semiconductor region (sixth semiconductor region) 8N3. The $n^+$-type semiconductor region 8N3 contains phosphor or arsenic, for example, and is placed adjacent to the $n^+$-type semiconductor region 8N2 with the separator 6A interposed therebetween. The $n^+$-type semiconductor region 8N3 is also formed so as to extend in parallel to the $n^+$-type semiconductor region 8N2. In the present embodiment, the p well 5P1 serves as the base (i.e., trigger electrode portion of parasitic PNPN thyristor TH) of the bipolar transistor Qth2. Incidentally, the $n^+$-type semiconductor region 8N3 is electrically connected to its corresponding first layer wring 11b3 through a contact hole 10d defined in the interlayer dielectric 9a and also electrically connected to the external terminal 1.

The trigger element TR has a $n^+$-type semiconductor region 8N3 and a $n^+$-type semiconductor region (seventh semiconductor region) 8N4 formed in the p well 5P1 lying within the active region L3, a gate insulator 12a and a gate electrode 13a. The pair of n$^+$-type semiconductor regions 8N3 and 8N4 form the source/drain of the trigger element TR and contain phosphor or arsenic, for example. A channel region is formed between the pair of n$^+$-type semiconductor regions 8N3 and 8N4 for the source/drain thereof. The channel region serves as a substrate electrode for the trigger element TR.

In the first embodiment, the substrate electrode of the trigger element TR and the base (trigger electrode portion of parasitic PNPN thyristor TH) of the bipolar transistor Qth2 of the parasitic PNPN thyristor TH are formed in the same p well 5P1. Thus, the value of the resistance between these can be reduced, and a substrate current produced in the trigger element TR can be injected into the base of the bipolar transistor Qth2 with efficiency. Further, a channel width direction (planar extending direction of gate electrode 13a) of the trigger element TR is placed so as to become parallel to a portion equivalent to the base of the bipolar transistor Qth2, whereby the path width of the substrate current can be ensured widely. It is therefore possible to reduce the resistance value between them. Thus, the parasitic PNPN thyristor TH can have a shortened turn-on time and an improved sensitivity. Accordingly, it is possible to cause an overcurrent produced due to the positive overvoltage to escape rapidly.

The present embodiment can provide such a structure that degradation of the sensitivity of the thyristor protective element will be hardly affected by a change in the size of the semiconductor region for forming the protective element. Thus, the device design of the protection circuit can be facilitated.

Further, the channel length of the trigger element TR is set to be substantially identical to that of the MOS for the internal circuit 2. Thus, the sensitivity of the thyristor protective element is set to the optimum value according to the elements (MOS) of the internal circuit 2. Namely, the sensitivity of the thyristor protective element can be set according to the scale down or reduction in size of each element of the internal circuit 2.

The gate insulator 12a of the trigger element TR comprises silicon oxide, for example. The gate electrode 13a comprises low-resistance polysilicon, for example, but the invention is not limited thereto. Various changes can be made thereto. The gate electrode 13a may be configured as a so-called polycide gate electrode structure in which a high melting-point silicide layer, such as cobalt silicide or tungsten silicide, is provided on low-resistance polysilicon, for example. Alternatively, the gate electrode 13a may be configured as a so-called polymetal gate electrode structure in which a metal film like tungsten or the like is provided over low-resistance polysilicon with a barrier like, for example, tungsten nitride interposed therebetween. The gate electrode 13a is electrically connected to its corresponding first layer wiring through a contact hole 10f defined in the interlayer dielectric 9a and also is electrically connected to the power terminal VSS on the low-potential side. Further, the n$^+$-type semiconductor region 8N4 is electrically connected to its corresponding first layer wiring 11a2 through a contact hole 10e defined in the interlayer electric 9a and also is electrically connected to the power terminal VSS on the low-potential side.

Incidentally, the interlayer dielectric 9a comprises silicon oxide, for example. The contact holes 10a through 10e are respectively formed so as to extend along the directions in which the respective semiconductor regions, in which the contact holes are placed, extend. Thus, the contact resistance of the wiring with each semiconductor region can be reduced. The first layer wirings 11a1, 11a2 and 11b1 through 11b3 respectively comprise a metal film like, for example, aluminum or an aluminum-silicon-copper alloy or the like.

Thus, according to the semiconductor device of the first embodiment, the provision of the above-described protection circuit 3 makes it possible to cause an overcurrent, relative to both the positive and negative overvoltages, to escape rapidly even when a SOI substrate 4 is used. Therefore, the semiconductor device formed on the SOI substrate 4 can be improved in yield. Accordingly, the semiconductor device can be reduced in cost.

Owing to the provision of the electrodes for the respective elements lying within each thyristor protection element within the same semiconductor region, the size of the thyristor protective element can be scaled down. Further, the resistance between the respective electrodes can be lowered. Therefore, even in the case of a semiconductor device in which a high-frequency signal circuit is provided in the internal circuit 2, each thyristor protective element can be incorporated into each circuit lying within the semiconductor device, particularly, the input thereof, without deterioration of its electrical characteristic (frequency characteristic), thereby making it possible to improve the electrostatic breakdown resistance.

Figure 10:
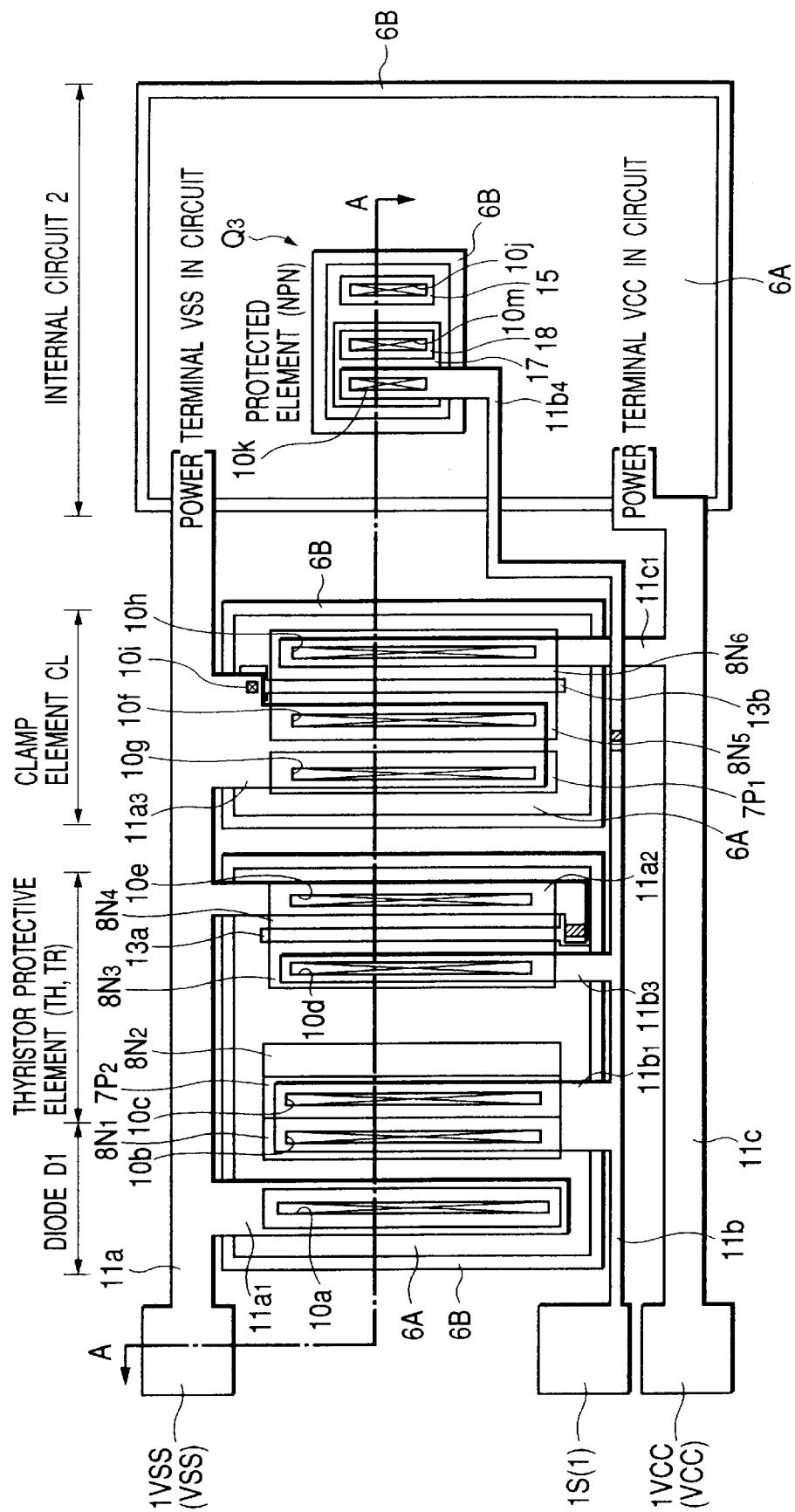
FIG. 10 is a fragmentary plan view of the semiconductor substrate showing, in further detail, the device structure employed in the semiconductor device shown in FIG. 3.

A specific example of a semiconductor device including the protection circuit 3 having the above-described thyristor structure will be described next with reference to FIGS. 10 through 12. FIG. 10 is a fragmentary plan view of the semiconductor device, FIG. 11 is a cross-sectional view taken along line A—A of FIG. 10, and FIG. 12 is a cross-sectional view of another portion of the semiconductor device shown in FIG. 10.

A clamp element CL, a bipolar transistor Q3, a PMOS Q1a and an NMOS Q1b are formed in the semiconductor layer 4C in addition to the diode D1, parasitic PNPN thyristor TH, and trigger element TR. The clamp CL, bipolar transistor Q3, and pMOS Q1a and nMOS Q1b are respectively formed in semiconductor layer 4C portions surrounded by separators 6B in a state of being electrically separated from one another.

Figure 11:
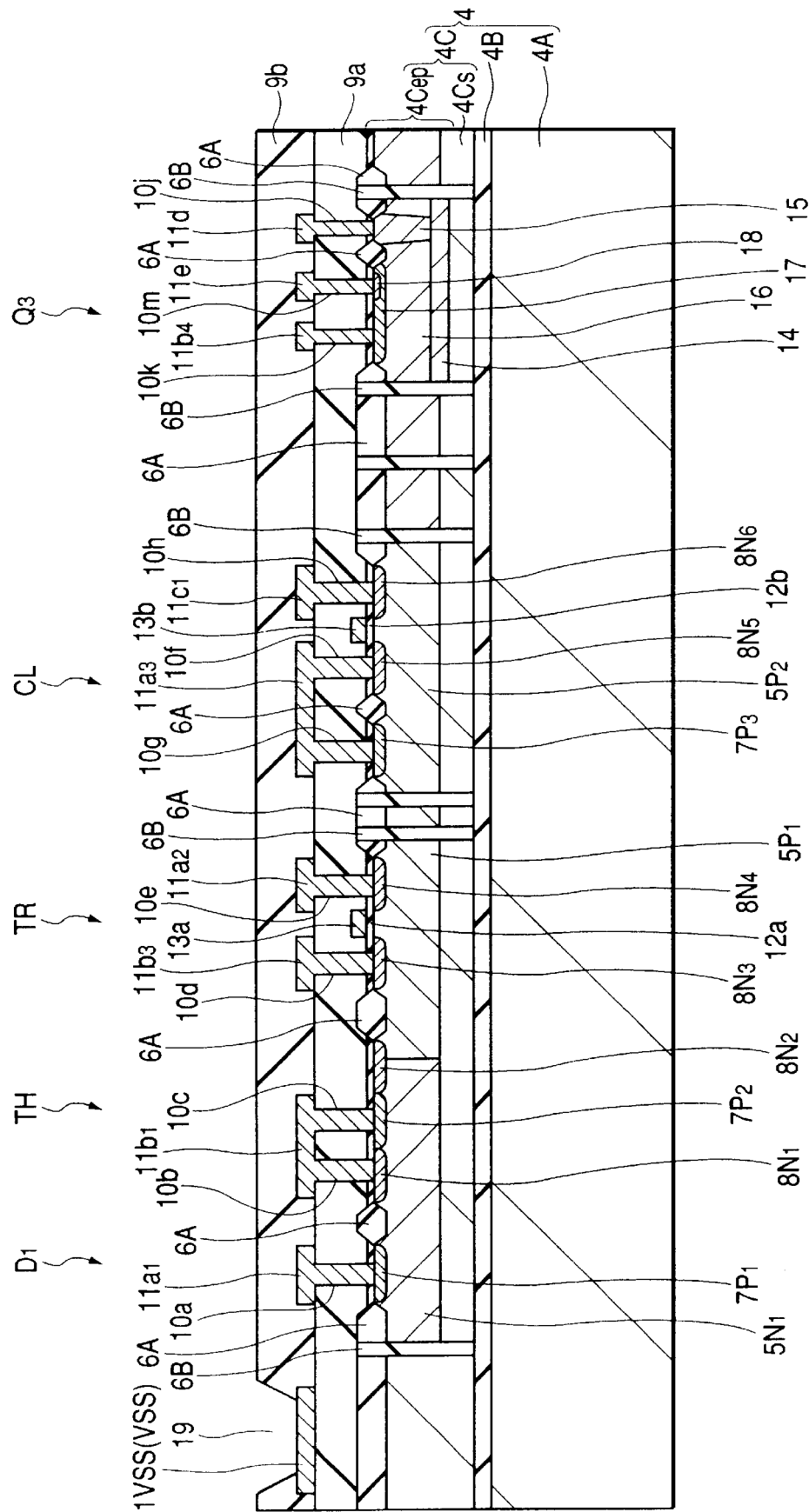
FIG. 11 is a cross-sectional view taken along line A—A of FIG. 10.
Figure 12:
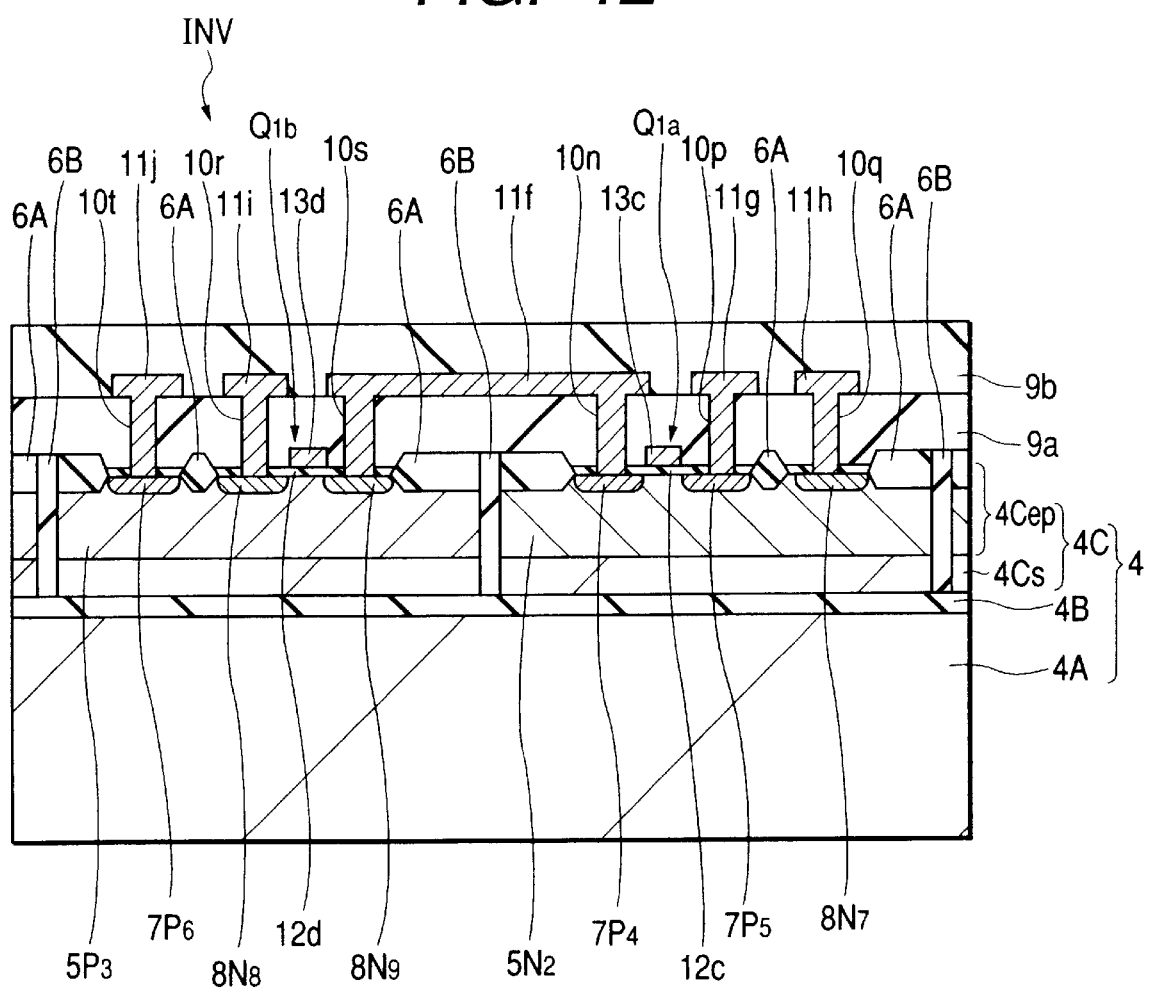
FIG. 12 is a cross-sectional view of predetermined portions of a PMOS and an NMOS constituting an internal circuit.

As shown in FIGS. 10 and 11, the clamp element CL is formed in the semiconductor layer 4C surrounded by the separator 6B and a buried insulating layer 4B. A p well 5P2 is formed in the semiconductor layer 4C. A pair of n$^+$-type semiconductor regions 8N5 and 8N6 which forms the source/drain of the clamp element CL, and a p$^+$-type semiconductor region 7P3 which forms a well potential supply portion, are formed over the p well 5P2. For instance, phosphor or arsenic is contained in the pair of n$^+$-type semiconductor regions 8N5 and 8N6. For example, boron is contained in the p$^+$-type semiconductor region 7P3 which forms the well potential supply portion.

The n$^+$-type semiconductor region 8N5 and the p$^+$-type semiconductor region 7P3 are electrically connected to their corresponding first layer wiring 11a3 through contact holes 10f and 10g defined in an interlayer dielectric 9a. The other n$^+$-type semiconductor region 8N6 is electrically connected to its corresponding first layer wiring 11c1 through a contact hole 10h defined in the interlayer dielectric 9a.

Incidentally, the n$^+$-type semiconductor region 8NS and the p$^+$-type semiconductor region 7P3 are separated from each other by the separator 6A.

The gate insulator 12b and the gate electrode 13b of the clamp element CL have the same structures as the gate insulator 12a and the gate electrode 13a of the trigger element TR. The gate electrode 13b is different from the above in that it is electrically connected to its corresponding first layer wiring 11a3 through a contact hole 10i defined in an interlayer dielectric 9b.

The bipolar transistor Q3 is formed in its corresponding semiconductor layer 4C surrounded by the separator 6B and the buried insulating layer 4B. A buried n+-type well 14, an n+-type semiconductor region 15, an n-type semiconductor region 16, a p-type semiconductor region 17 and an n+-type semiconductor region 18 are formed in the semiconductor layer 4C. The bipolar transistor Q3 comprises, for example, a vertical NPN bipolar transistor. The collector thereof has the buried n+-type well 14, an n+-type semiconductor region 15 and n-type semiconductor region 16.

The buried n+-type well 14 is a layer corresponding to the buried collector layer and has the function of reducing the collector resistance. For example, stibium (Sb) is contained in the buried n+-type well 14. The n+-type semiconductor region 15 and the n-type semiconductor region 16 are electrically connected to the buried n+-type well 14. The n+-type semiconductor region 15 has, for example, phosphor or arsenic contained therein and forms a collector drawing region. Further, the n+-type semiconductor region 15 is electrically connected to its corresponding first layer wiring 11d through a contact hole 10j defined in the interlayer dielectric 9a. The n-type semiconductor region 16 contains, for example, phosphor or arsenic. The p-type semiconductor region 17 for the base of the bipolar transistor Q3 is formed over the n-type semiconductor region 16.

The base p-type semiconductor region 17 contains boron, for example, and is electrically connected to its corresponding first layer wiring 11b4 through a contact hole 10k defined in the interlayer dielectric 9a. The n+-type semiconductor region 18 for the emitter of the bipolar transistor Q3 is formed over the p-type semiconductor region 17. The emitter n+-type semiconductor region 18 contains, for example, phosphor or arsenic and is electrically connected to its corresponding first layer wiring 11e through a contact hole 10m defined in the interlayer dielectric 9a. Incidentally, the collector-drawing n+-type semiconductor region 15 and the base p-type semiconductor region 17 are electrically separated from each other by the separator 6A interposed therebetween.

On the other hand, a PMOS Q1a is formed in its corresponding semiconductor layer 4C surrounded by a separator 6B and a buried insulating layer 4B, as shown in FIG. 12. An n well 5N2 is formed in the semiconductor layer 4C. A pair of p+-type semiconductor regions 7P4 and 7P5 which form the source/drain of the pMOS Q1a, and an n+-type semiconductor region 8N7 which forms a well potential supply portion, are formed over the n well 5N2. For instance, boron is contained in the pair of p+-type semiconductor regions 7P4 and 7P5. For example, phosphor or arsenic is contained in the n+-type semiconductor region 8N7 which forms the well potential supply portion.

The p+-type semiconductor regions 7P4 and 7P5 are electrically connected to their corresponding first layer wirings 11f and 11g through contact holes 10n and 10p defined in an interlayer dielectric 9a. The n+-type semiconductor region 8N7 is electrically connected to its corresponding first layer wiring 11h through a contact hole 10q defined in the interlayer electric 9a. Incidentally, the p+-type semiconductor region 7P5 and the n type semiconductor region 8N7 are separated from each other by a separator 6A.

A gate insulator 12c and a gate electrode 13c of the pMOS Q1a have the same structures (are equal in material and thickness) as the gate insulator 12a and the gate electrode 13a of the trigger element TR. The gate electrode 13c is different from the above in that it is electrically connected to its corresponding gate electrode 13d of a pMOS Q1b.

An nMOS Q1b is formed in its corresponding semiconductor layer 4C surrounded by the separator 6B and the buried insulating layer 4B. A p well 5P3 is formed in the semiconductor layer 4C. A pair of n+-type semiconductor regions 8N8 and 8N9, which form the source/drain of the NMOS Q1b, and a p+-type semiconductor region 7P6 which forms a well potential supply portion, are formed over the p well 5P3. For instance, phosphor or arsenic is contained in the pair of n+-type semiconductor regions 8N8 and 8N9. For example, boron is contained in the p+-type semiconductor region 7P6 which forms the well potential supply portion.

The n+-type semiconductor regions 8N8 and 8N9 are electrically connected to their corresponding first layer wirings 11i and 11if through contact holes 10r and 10s defined in the interlayer dielectric 9a. The p+-type semiconductor region 7P6 is electrically connected to its corresponding first layer wiring 11j through a contact hole 10t defined in the interlayer dielectric 9a. Incidentally, the n+-type semiconductor region 8N8 and the p+-type semiconductor region 7P6 are separated from each other by the separator 6A. A gate insulator 12d and a gate electrode 13d of the nMOS Q1a have the same structures (are equal in material and thickness) as the gate insulator 12a and the gate electrode 13a of the trigger element TR.

As shown in FIG. 10, an external terminal 1VSS is used for supplying low-potential power or power supply from the outside of a semiconductor chip to the inside thereof and also serves as one power or source terminal VSS on the low-potential side. The external terminal 1VSS is electrically connected to the respective portions of the protection circuit 3 and is electrically connected to its corresponding power terminal VSS in the internal circuit 2 through the first layer wirings 11a, and 11a1 through 11a3 are pattern formed integrally with the external terminal 1VSS.

An external terminal 1S(1) is a terminal for transmitting a signal from the outside of the semiconductor chip to the inside thereof. The external terminal 1S(1) is electrically connected to the respective portions of the protection circuit 3 through first layer wirings 11b, where 11b1 and 11b3 are pattern-formed integrally with the external terminal 1S(1) and electrically connected to the corresponding input terminal (corresponding to the base of the bipolar transistor Q3 herein) of the corresponding circuit in the internal circuit 2 through a first layer wiring 11b4.

Further, an external terminal 1VCC is used for supplying high-potential power from the outside of the semiconductor chip to the inside thereof, and it also serves as one power terminal VCC on the high-potential side. The external terminal 1VCC is electrically connected to part of the protection circuit 3 and is electrically connected to a power terminal VCC in the internal circuit 2 through the corresponding first layer wirings 11c and 11c1, pattern-formed integrally with the external terminal 1VCC.

Incidentally, the first layer wirings 11a, 11a1 through 11a3, 11b, 11b1, 11b3, 11b4, 11c and 11c1 are covered with a surface protective film 9b. The surface protective film 9b comprises a single layer film comprised of, for example, silicon oxide, a laminated film obtained by depositing or stacking a silicon nitride film on a silicon oxide film or a laminated film obtained by stacking a polyimide film on a silicon oxide film with a silicon nitride film interposed therebetween. Such apertures or openings 19 as to expose the external terminals 1, 1S, 1VSS and 1VCC are defined in some of the surface protective film 19.

One example of a method of manufacturing the SOI substrate 4' employed in the semiconductor device according to the first embodiment will next be described with reference to each of FIGS. 13(a) through 13(c) and FIGS. 14(a) through 14(d).

Figure 13A:
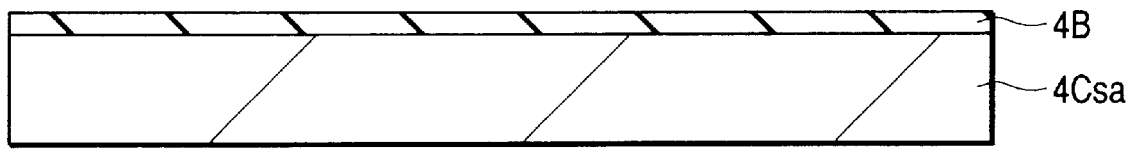
FIGS. 13(a) through 13(c) are fragmentary cross-sectional views showing steps during a process for manufacturing the semiconductor substrate shown in FIGS. 8 and 9.
Figure 13B:
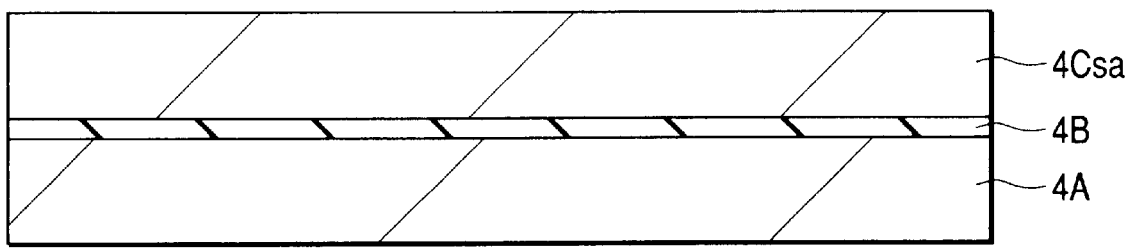
Figure 13C:
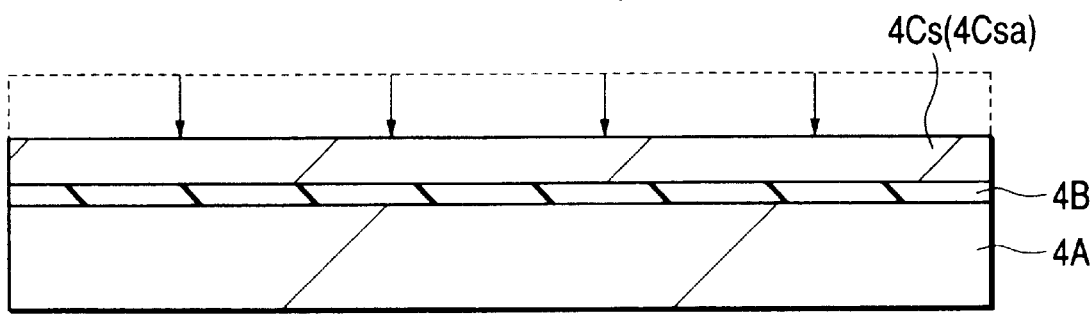

As shown in FIG. 13(a), a buried insulating layer 4B comprised of silicon oxide is first formed over the surface of a semiconductor layer forming substrate 4Csa (corresponding to a semiconductor thin plate called a planar and substantially-circular semiconductor wafer, for example, in this stage) comprising, for example, a p-type silicon single crystal using, for example, a thermal oxidation method or the like. Subsequently, a support substrate 4A (corresponding to a semiconductor thin plate called a planar and substantially-circular semiconductor wafer, for example, in this stage) comprising, for example, a p-type silicon single crystal is prepared aside from the semiconductor layer forming substrate 4Csa, as shown in FIG. 13(b). The semiconductor layer forming substrate 4Csa and the support substrate 4A are laminated together with a buried insulating layer 4B interposed therebetween and are subjected to heat treatment (heated at 1100° C. or less, for example). The back or reverse side of the semiconductor layer forming substrate 4Csa is thereafter polished to thereby form a semiconductor substrate layer 4Cs, as shown in FIG. 13(c). Afterwards, an epitaxial layer comprising a p-type silicon single crystal, for example, is formed on the semiconductor substrate layer 4Cs to thereby manufacture the SOI substrate 4. In this technology, the semiconductor substrate layer 4Cs is excellent in crystallinity. Since the buried insulating layer 4B is formed by the thermal oxidation method, defects such as pinholes, etc. can be reduced.

Figure 14A:
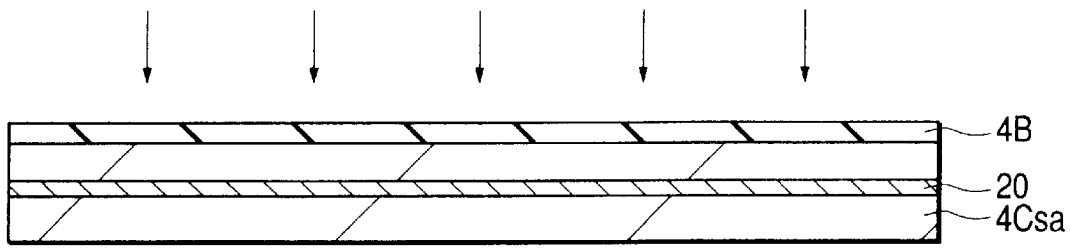
FIGS. 14(a) through 14(d) are fragmentary cross-sectional views showing steps during a process for manufacturing the semiconductor substrate shown in FIGS. 8 and 9.
Figure 14B:
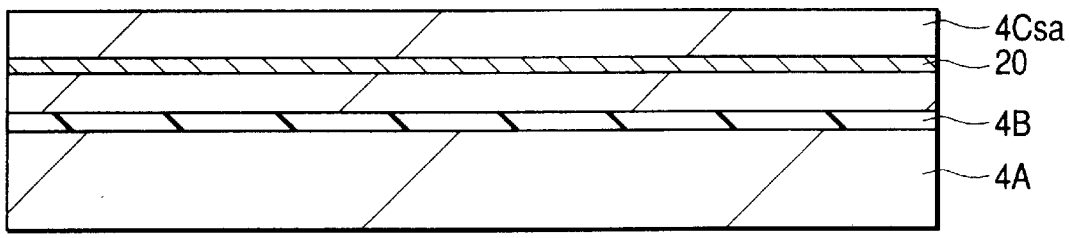
Figure 14C:
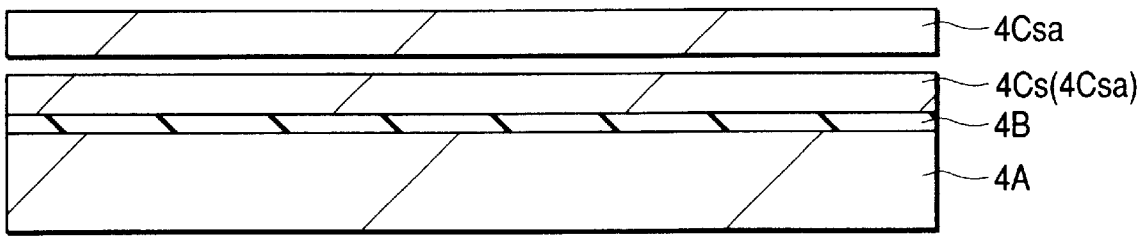
Figure 14D:
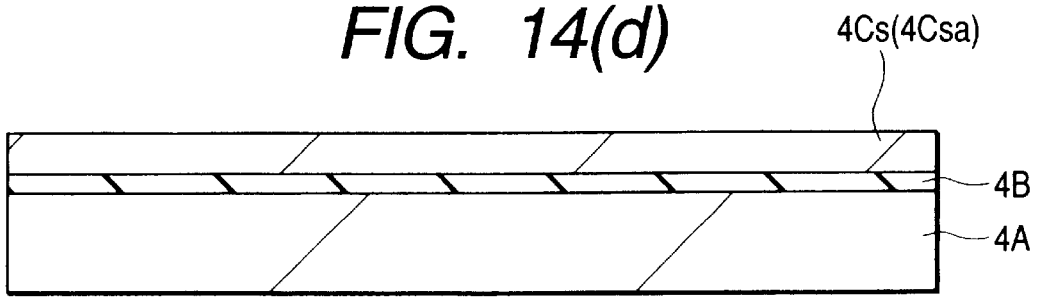

The SOI substrate 4 may be fabricated in the following manner, for example. A buried insulating layer 4B is firstly formed on the surface of a semiconductor layer forming substrate 4Csa, as shown in FIG. 14(a), in a manner similar to the above. Afterwards, hydrogen or the like is implanted in a predetermined depth position of the semiconductor layer forming substrate 4Csa with the buried insulating layer 4B formed thereon using an ion implantation method or the like, to thereby form an implanted layer 20. Subsequently, the semiconductor layer forming substrate 4Csa and the support substrate 4A are laminated together with the buried insulating layer 4B interposed therebetween and are subjected to heat treatment (heated at 1100° C. or less, for example), as shown in FIG. 14(b). At this time, a micro crack is developed in the implanted layer 20, whereby the partial semiconductor layer forming substrate 4Csa is left on the buried insulating layer 4B, to thereby form a semiconductor substrate layer 4Cs and peel off the remaining semiconductor layer forming substrate 4Csa portion, as shown in FIG. 14(c). Thereafter, the surface of the semiconductor substrate layer 4Cs is lightly polished and subjected to surface processing. Afterwards, an epitaxial layer is formed in a manner similar to the above to thereby manufacture the SOI substrate 4. In this technology, the thickness of the semiconductor substrate layer 4Cs can be set by an ion implantation method that has a high controllability, in addition to the effect obtained by the manufacturing technology shown in FIGS. 13(a) through 13(c). Therefore, the semiconductor substrate layer 4Cs can have an improved thickness uniformity.

One example of a method of manufacturing the semiconductor device according to the first embodiment will next be described with reference to FIGS. 15(a) and 15(b) through FIGS. 18(a) and 18(b). Incidentally, FIGS. 15(a), 16(a), 17(a) and 18(a) of FIGS. 15(a) and 15(b) through FIGS. 18(a) and 18(b), respectively, show cross-sections of an SOI substrate 4 at a protection circuit 3 portion, and FIGS. 15(b), 16(b), 17(b) and 18(b) thereof respectively show cross-sections of the SOI substrate 4 at a CMOS circuit portion.

Figure 15A:
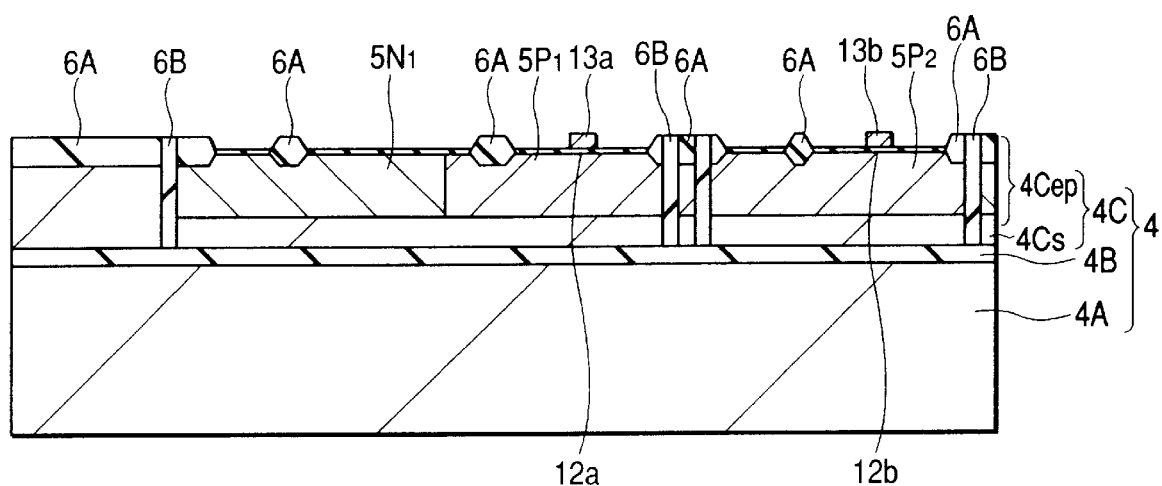
FIGS. 15(a) and 15(b) are fragmentary cross-sectional views showing steps during a process for manufacturing the semiconductor device shown in FIGS. 8 and 9.
Figure 15B:
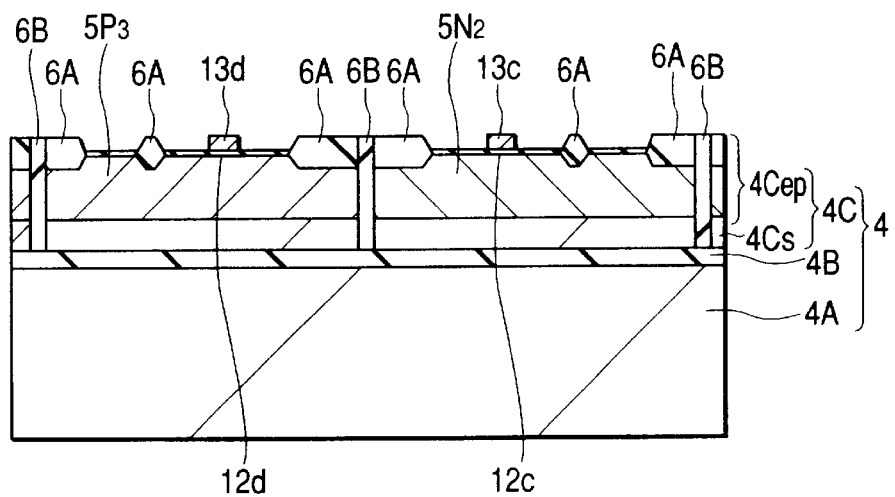

FIGS. 15(a) and 15(b) are fragmentary cross-sectional views showing an SOI substrate 4 (corresponding to a planar circular thin plate called a semiconductor wafer in this stage) during a manufacturing process of the semiconductor device according to the first embodiment. A semiconductor layer 4C includes an epitaxial layer 4Cep formed on a semiconductor substrate layer 4Cs. Separators 6A are formed on a principal or main surface thereof by a LOCOS method or the like, for example. Further, separators 6B are formed by digging trenches reaching a buried insulating layer 4B from the upper surfaces of the separators 6A and embedding an insulating film comprising a silicon oxide film or the like thereinside. n wells 5N1 and 5N2 and p wells 5P1 through 5P3 are formed in the semiconductor layer 4C.

Gate insulators 12a through 12d are formed on the main surface of the semiconductor layer 4C. The gate insulators 12a through 12d respectively comprise a silicon oxide film, for example, and are formed by the same thermal oxidation process, for example. In the first embodiment as described above, the gate insulator 12a of the nMOS for a trigger element and the gate insulators 12c and 12d of the MOS for an internal circuit are formed by the same thermal oxidation process.

Further, gate electrodes 13a through 13d are formed on the gate insulators 12a through 12d, respectively. The gate electrode 13a is formed by, for example, depositing, for example, a low-resistance polysilicon film or the like on the main surface of the SOI substrate 4 by a CVD (Chemical Vapor Deposition) method or the like and thereafter patterning it using a photolithography process and a dry etching process.

In the first embodiment as described above, the gate electrode 13a of the NMOS for the trigger element and the gate electrodes 13c and 13d of the MOS for the internal circuit are pattern-formed by the same conductor film in the same process.

Figure 16A:
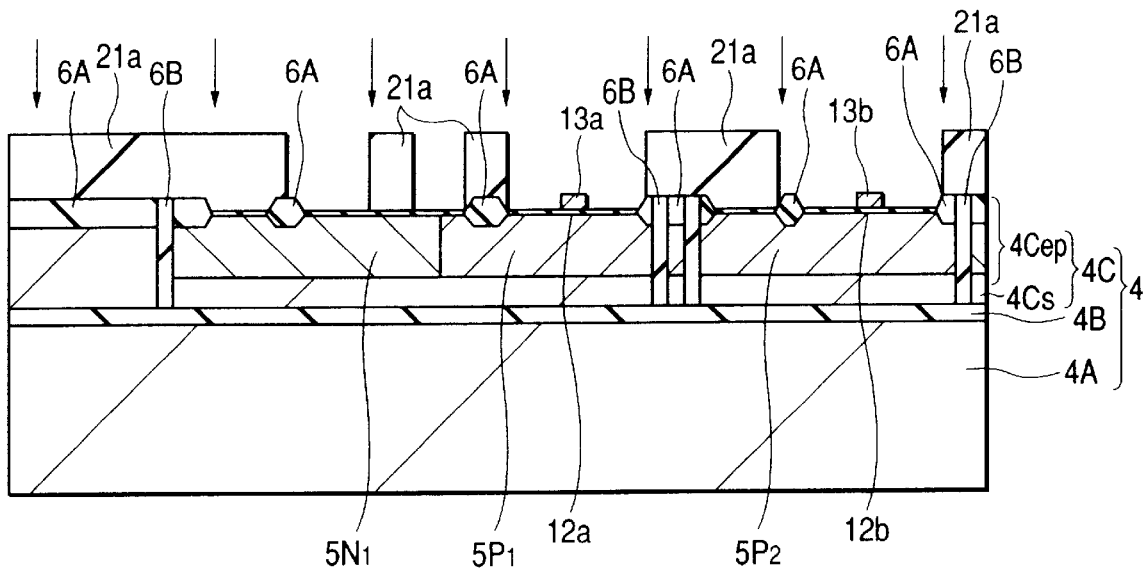
FIGS. 16(a) and 16(b) are respectively fragmentary cross-sectional views showing steps during a process for manufacturing the semiconductor device, following the step shown in FIG. 15(b)
Figure 16B:
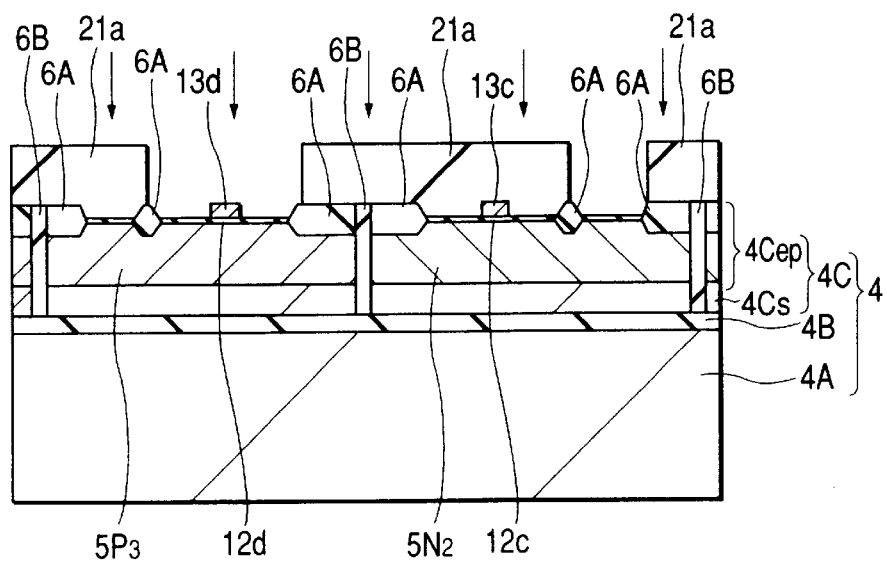
Figure 17A:
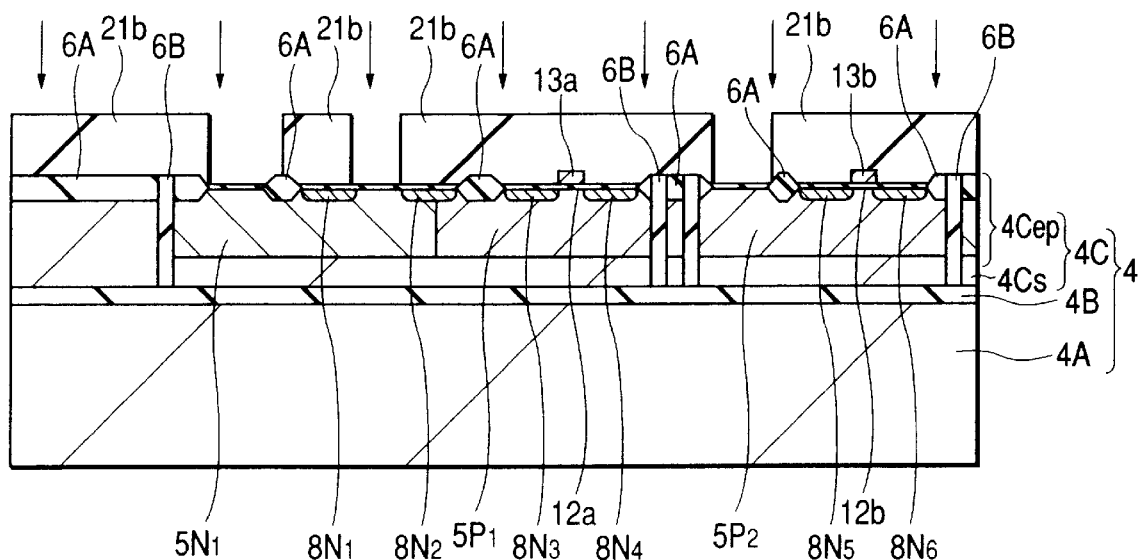
FIGS. 17(a) and 17(b) are fragmentary cross-sectional views showing steps during a process for manufacturing the semiconductor device, following the step shown in FIG. 16(b)
Figure 17B:
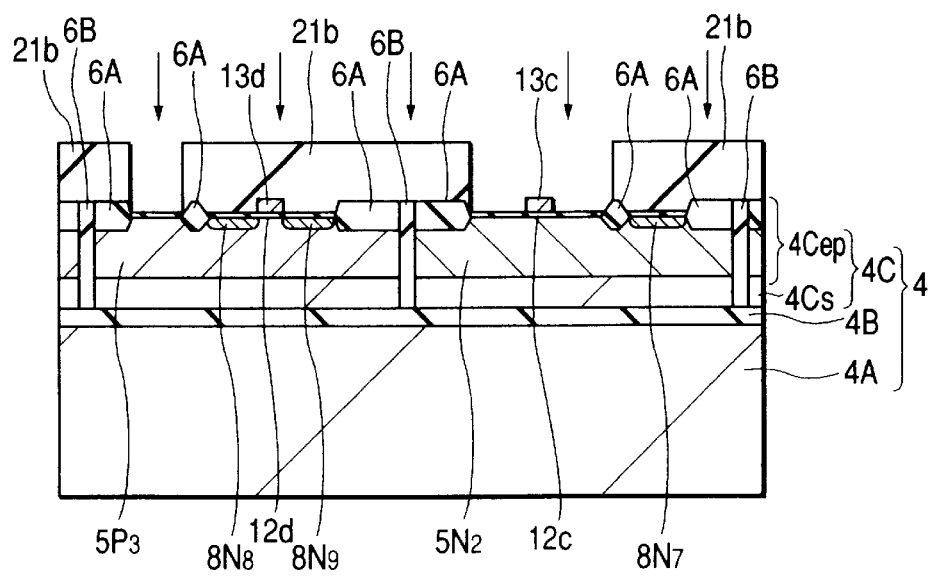

As shown in FIGS. 16(a) and 16(b), a photoresist pattern 21a, in which regions for forming n-type semiconductor regions are exposed and those other than the regions are covered, is firstly formed on such an SOI substrate 4. Subsequently, for example, phosphor or arsenic is introduced into the semiconductor layer 4C by an ion implantation method or the like using the photoresist pattern 21a as a mask, followed by removal of the photoresist pattern 21a. According to such an impurity introducing process, $n^+$-type semiconductor regions 8N1 through 8N9 are formed as shown in FIGS. 17(a) and 17(b). Thus, in the first embodiment, the $n^+$-type semiconductor regions 8N3 and 8N4 for the source/drain of the nMOS for the trigger element and the $n^+$-type semiconductor regions 8N8 and 8N9 for the source/drain of the nMOS for the internal circuit are formed in the same process.

Figure 18A:
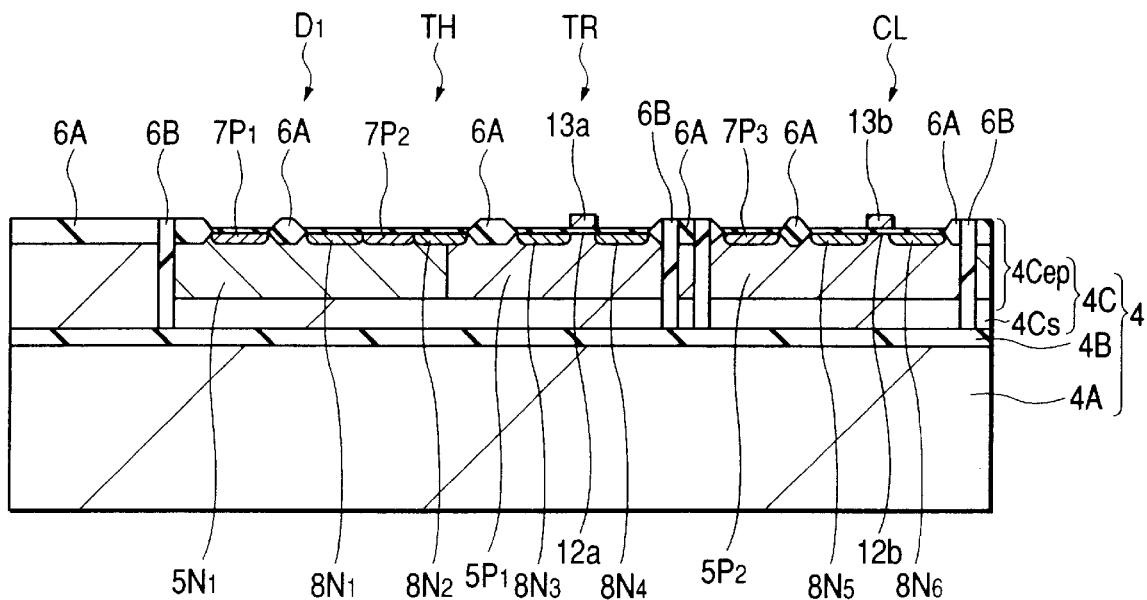
FIGS. 18(a) and 18(b) are fragmentary cross-sectional views showing steps during a process for manufacturing the semiconductor device, following the step shown in FIG. 17(b)
Figure 18B:
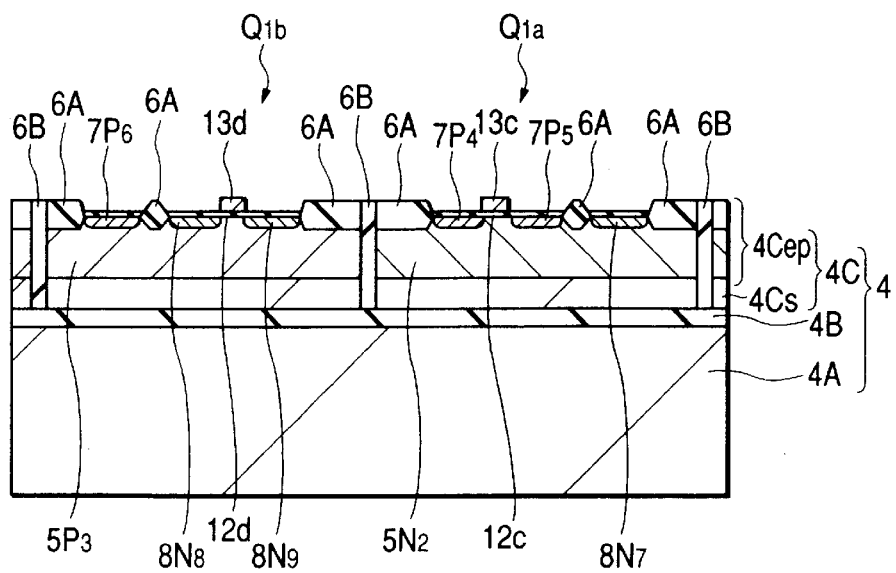

Next, a photoresist pattern 21b, in which regions for forming p-type semiconductor regions are exposed and those other than them are covered, is formed on the SOI substrate 4. Thereafter, for example, boron is introduced into the semiconductor layer 4C by the ion implantation method or the like using the photoresist pattern 21b as a mask. As shown in FIGS. 18(a) and 18(b), $p^+$-type semiconductor regions 7P1 through 7P6 are formed according to such an impurity introducing process.

In the method of manufacturing the semiconductor device according to the first embodiment as described above, the respective portions of the trigger element TR for driving the parasitic PNPN thyristor TH and the respective portions of the elements in the internal circuit 2 to be protected are formed in the same process without being formed in several. Namely, the trigger element TR is formed in association with each element in the internal circuit 2. Therefore, if, for example, the size (e.g., the plane size of each portion and the thickness of gate insulator) of each element (MOS) for the internal circuit 2 becomes small, then the size (e.g., the plane size of each portion and the thickness of gate insulator) of the trigger element TR becomes small correspondingly and the time required to turn on the parasitic PNPN thyristor TH can also be shortened. Namely, the sensitivity of the thyristor protective element can be set to the optimum value according to each element (MOS) of the internal circuit 2. It is thus possible to form a thyristor protective element that is optimum to protect the element (MOS) of the internal circuit 2. As to this point of view, a similar effect is obtained even in the case of a clamp element CL.

There is no need to add a new process and a complex process for the purpose of forming the thyristor protective element. Therefore, a semiconductor device having a thyristor protective element can be manufactured without an increase in manufacturing time and cost. It is thus possible to reduce the cost of a semiconductor device having a thyristor protective element.

Second Embodiment

Figure 19:
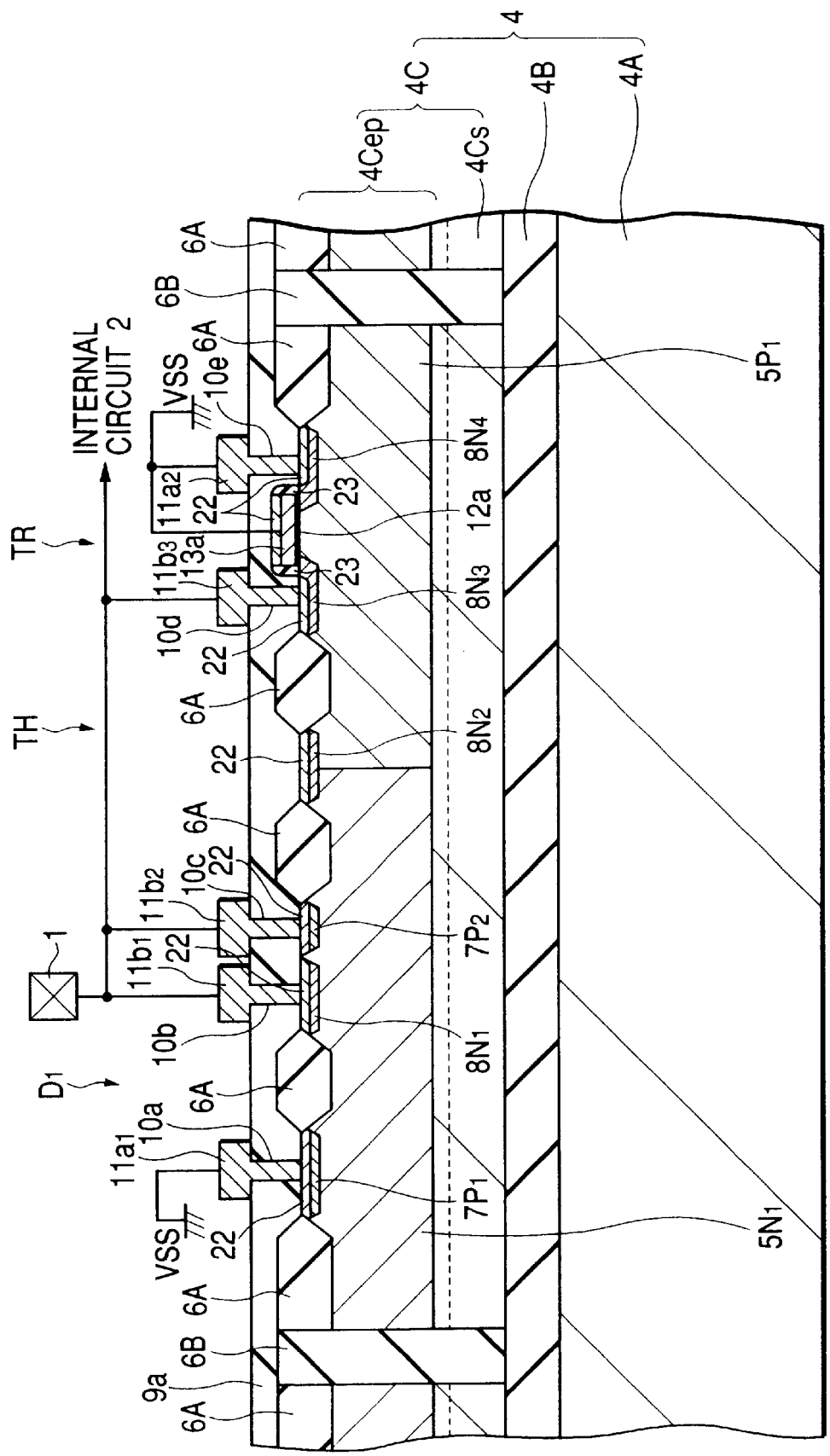
FIG. 19 is a fragmentary cross-sectional view of a semiconductor device showing another embodiment of the present invention.

In the present second embodiment, a silicide layer 22 is formed on each of the surface layers of $p^+$-type semiconductor regions 7P1 and 7P2, $n^+$-type semiconductor regions 8N1 through 8N4 and a gate electrode 13a, as shown in FIG. 19. The silicide layer 22 comprises a high melting-point metal silicide, such as cobalt silicide, titanium silicide or tungsten silicide, and is formed according to the normal silicide process.

Incidentally, side walls 23 are formed on corresponding sides of the gate electrode 13a. The side walls 23 comprise a silicon oxide film, for example, and are formed so as to electrically disconnect the silicide layer 22 provided on the surface layer of the gate electrode 13a and the silicide layer 22 provided on each of the $n^+$-type semiconductor regions 8N3 and 8N4 for the source/drain.

In the second embodiment as described above, even in the case of a semiconductor device in which a high-frequency signal circuit is provided in an internal circuit 2, a thyristor protective element can be incorporated into each circuit lying in the semiconductor device, particularly, the input thereof, without deterioration of its electrical characteristic (frequency characteristic).

The formation of the silicide layers 22 on the surface layers of the semiconductor regions for the source/drain of MOS constituting the internal circuit 2 and the surface layer of the gate electrode allows an improvement in the electrical characteristic (frequency characteristic in particular) of the internal circuit 2. Therefore, the operating speed of the semiconductor device can be increased. Since the silicide layers 22 can simultaneously be formed in the protection circuit 3 and the internal circuit 2 according to the normal silicide process, it is not necessary to additionally provide a manufacturing process in particular even though such a structure is adopted. Even in this case, the side walls 23 are formed on corresponding sides of the gate electrode of MOS for the internal circuit 2.

On the other hand, in the second embodiment, for example, the following structural contrivances are made when the silicide process is adopted in a semiconductor device having a thyristor protective element.

In a region for forming a bipolar transistor QTH1 of a parasitic PNPN thyristor TH, a separator 6A is formed between the $p^+$-type semiconductor region 7P2 (emitter) and the $n^+$-type semiconductor region 8N2 (base) This is done to prevent the following. Namely, when the silicide layers 22 are formed lightly without forming the separator 6A at that place, the $p^+$-type semiconductor region 7P2 and the $n^+$-type semiconductor region 8N2 are electrically connected to each other through the silicide layers 22. Thus, the base and emitter of the bipolar transistor QTH1 of the parasitic PNPN thyristor TH are connected to each other through the silicide layers 22 under a low resistance, whereby the bipolar transistor QTH1 is deactivated. Since a resistor Rth1 (diffused resistor or resistance of n well SN1) parallel-connected between the base and emitter of the bipolar transistor QTH1 can be increased to some extent owing to the provision of the separator 6A between the $p^+$-type semiconductor region 7P2 and the $n^+$-type semiconductor region 8N2, it is possible to facilitate the turning on of the bipolar transistor QTH1. Namely, the parasitic PNPN thyristor TH can have an improved sensitivity.

Since those other elements than the above-described structure and manufacturing method are identical to those elements employed in the first embodiment, their description will be omitted.

Third Embodiment

Figure 20:
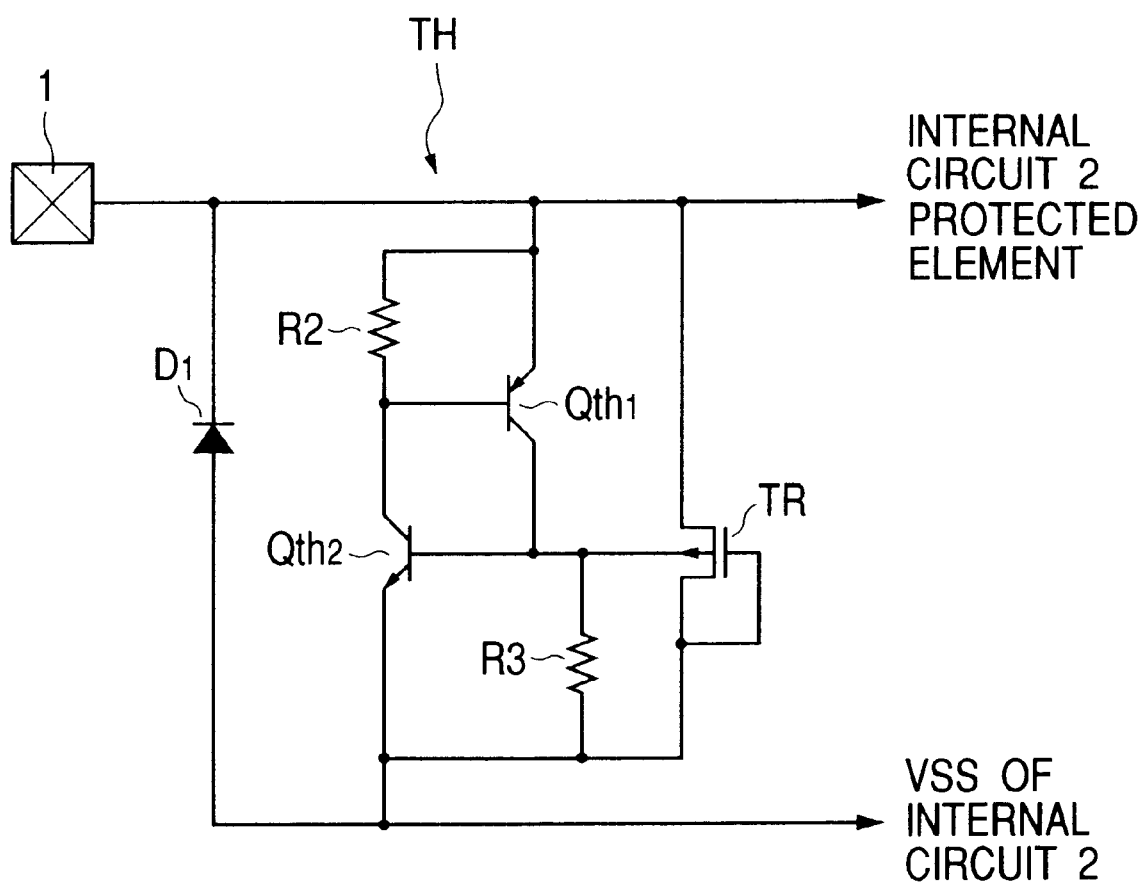
FIG. 20 is a fragmentary circuit diagram of a semiconductor device illustrating a further embodiment of the present invention.

In the present third embodiment, as shown in FIG. 20, a resistor (first resistor) R2 is electrically connected between the base of a bipolar transistor Qth1 of a parasitic PNPN thyristor TH and an external terminal 1; and a resistor (second resistor) R3 is electrically connected between the base (trigger electrode portion) of a bipolar transistor Qth2 of the parasitic PNPN thyristor TH and a source or power terminal VSS. Incidentally, the resistor R2 may be omitted.

An improvement in the sensitivity of the thyristor protective element has been achieved in the first and second embodiments. However, when the turn-on current of the parasitic PNPN thyristor TH is set too small in value for the improvement in its sensitivity, the parasitic PNPN thyristor TH will operate due to factors other than an overvoltage.

Therefore, the resistors R2 and R3 are positively incorporated into a circuit and their resistance values are adjusted in the third embodiment. Thus, since the turn-on current of the parasitic PNPN thyristor TH can be set to a suitable value, the above-described malfunction of the parasitic PNPN thyristor TH can be prevented from occurring.

Such resistors R2 and R3 can be formed by a resistance (hereinafter called a diffused resistance) using a diffused layer or a resistance (hereinafter called a polysili resistance) using a polysilicon film. The diffused resistance is formed by introducing an impurity into the semiconductor layer 4C of the SOI substrate 4. The polysili resistance is formed on the semiconductor layer 4C of the SOI substrate 4 in a pattern. Since the accuracy of setting of the resistance values and the reproducibility thereof are high in either case, the design of the circuit and device for the thyristor protective element can be facilitated. Since, the polysili resistance can be formed on the SOI substrate 4 in the case of the polysili resistance in particular, the planar size of the thyristor protective element can be reduced as compared with the diffused resistance.

Incidentally, the value of the resistor R2 results in the sum of the resistance of an n well SN1 and the diffused resistance (or polysili resistance). Further, the value of the resistor R3 results in the sum of the resistance of a p well 5P1 and the diffused resistance (or polysili resistance). However, since they become effective in either case, when the diffused resistance (or polysili resistance) is set higher than the resistance of each well, the resistances of the n well 5N1 and p well 5P1 can be ignored.

Figure 21:
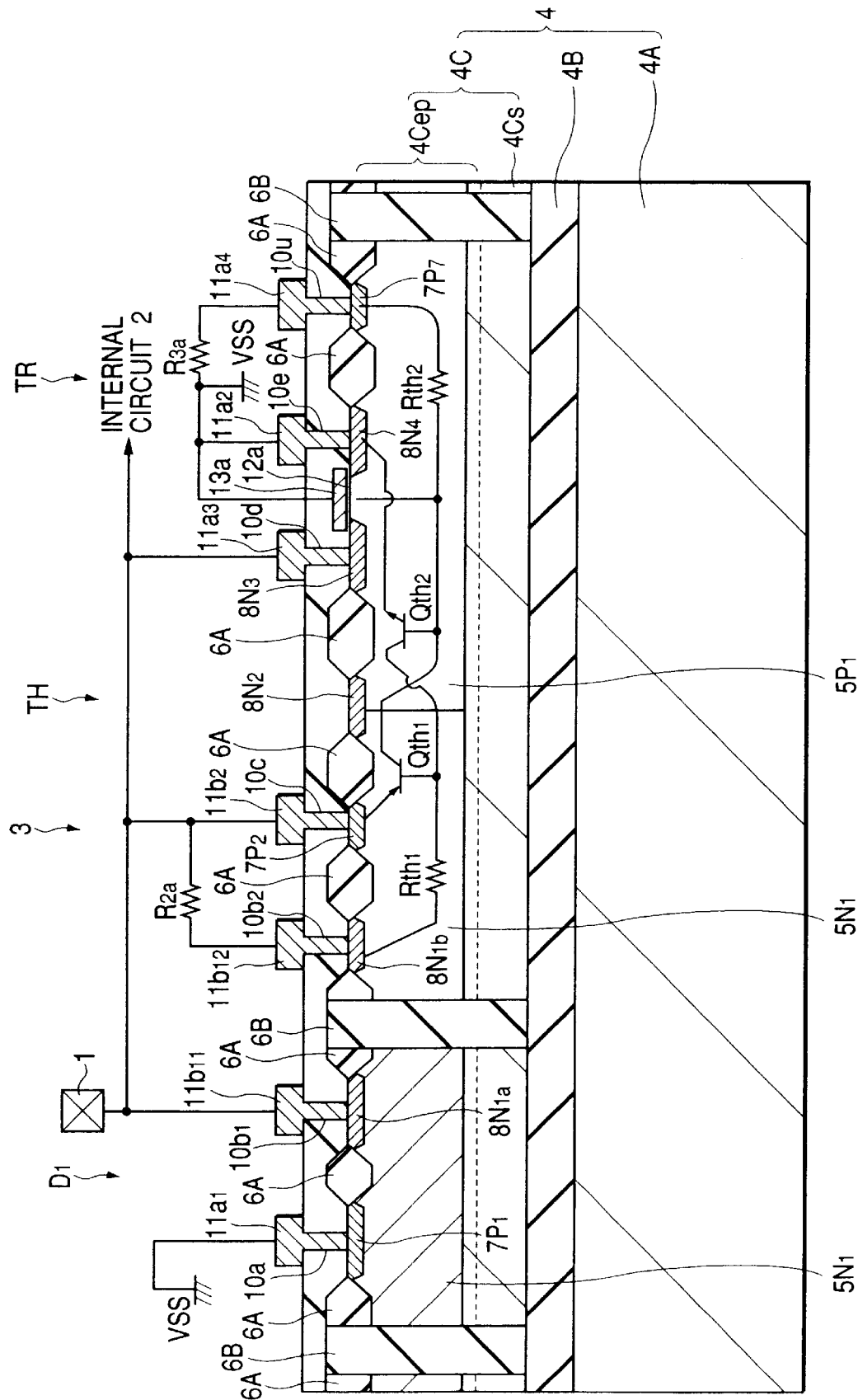
FIG. 21 is a fragmentary cross-sectional view of the semiconductor device illustrative of the structure of the device of FIG. 20.

One example of a device structure in such a case is shown in FIG. 21. A diode D1 and a parasitic PNPN silicide TH are electrically separated from each other by a separator 6A and a trench-type separator 6B. Namely, the diode D1 and thyristor protective elements (parasitic PNPN thyristor TH and trigger element TR) are formed in discrete semiconductor layers 4C isolated from each other. An $n^+$-type semiconductor region 8N1 is divided into $n^+$-type semiconductor region 8N1$a$ and $n^+$-type semiconductor region (third semiconductor region) 8N1$b$ by the separators 6A and 6B. The $n^+$-type semiconductor region 8N1$a$ connected to the diode D1 is electrically connected to its corresponding first layer wiring 11$b$11 through a contact hole 10$b$12 and is electrically connected to an external terminal 1 through the first layer wiring 11$b$11. On the other hand, the $n^+$-type semiconductor region 8N1$b$ connected to the base of a bipolar transistor Q1$a$ of the parasitic PNPN thyristor TH is electrically connected to its corresponding first layer wiring 11$b$12 through a contact hole 10$b$2 and is electrically connected to an external resistor R2$a$ through the first layer wiring 11$b$12. Further, the $n^+$-type semiconductor region 8N1$b$ is electrically connected to the external terminal 1 (1S) through the resistor R2$a$.

Owing to the provision of the separator 6A between the $n^+$-type semiconductor region 8N1$b$ connected to the base of the bipolar transistor Q1$a$ of the parasitic PNPN thyristor TH and a $p^+$-type semiconductor region 7P2 connected thereto, the separation between the $n^+$-type semiconductor region 8N1$b$ and the $p^+$-type semiconductor region 7P2 is carried out and a resistor Rth1 formed in an n well 5N1 lying therebetween is increased. The resistor R2 shown in FIG. 20 is formed as the sum of the resistor R2$a$ and the resistor Rth1. In the present example, the value of the resistor R2$a$ is set higher than the value of the resistor Rth1 and determines an effective value of the resistor R2.

Further, the separator 6A is formed even between the $p^+$-type semiconductor region 7P2 and an $n^+$-type semiconductor region 8N2. A $p^+$-type semiconductor region (ninth semiconductor region) 7P7 is formed in a region surrounded by the separator 6A at a portion above a p well SP1. The $p^+$-type semiconductor region 7P7 comprises the p well 5P1 containing boron, for example, and is electrically connected to a substrate electrode of nMOS constituting the trigger element TR through a resistor Rth2 formed in the p well 5P1. Further, the $p^+$-type semiconductor region 7P7 is electrically connected to its corresponding first layer wiring 11$a$4 through a contact hole 10$u$ defined in an interlayer dielectric 9$a$ and is electrically connected to an external resistor R3$a$ through the first layer wiring 11$a$4. Further, the $p^+$-type semiconductor region 7P7 is electrically connected to a power terminal VSS on the low-potential side through the resistor R3$a$. The resistor R3 shown in FIG. 20 is formed as the sum of the resistor R3$a$ and the resistor Rth2. In the present example, the value of the resistor R3$a$ is set higher than the value of the resistor Rth2 and determines an effective value of the resistor R3.

Fourth Embodiment

Figure 22:
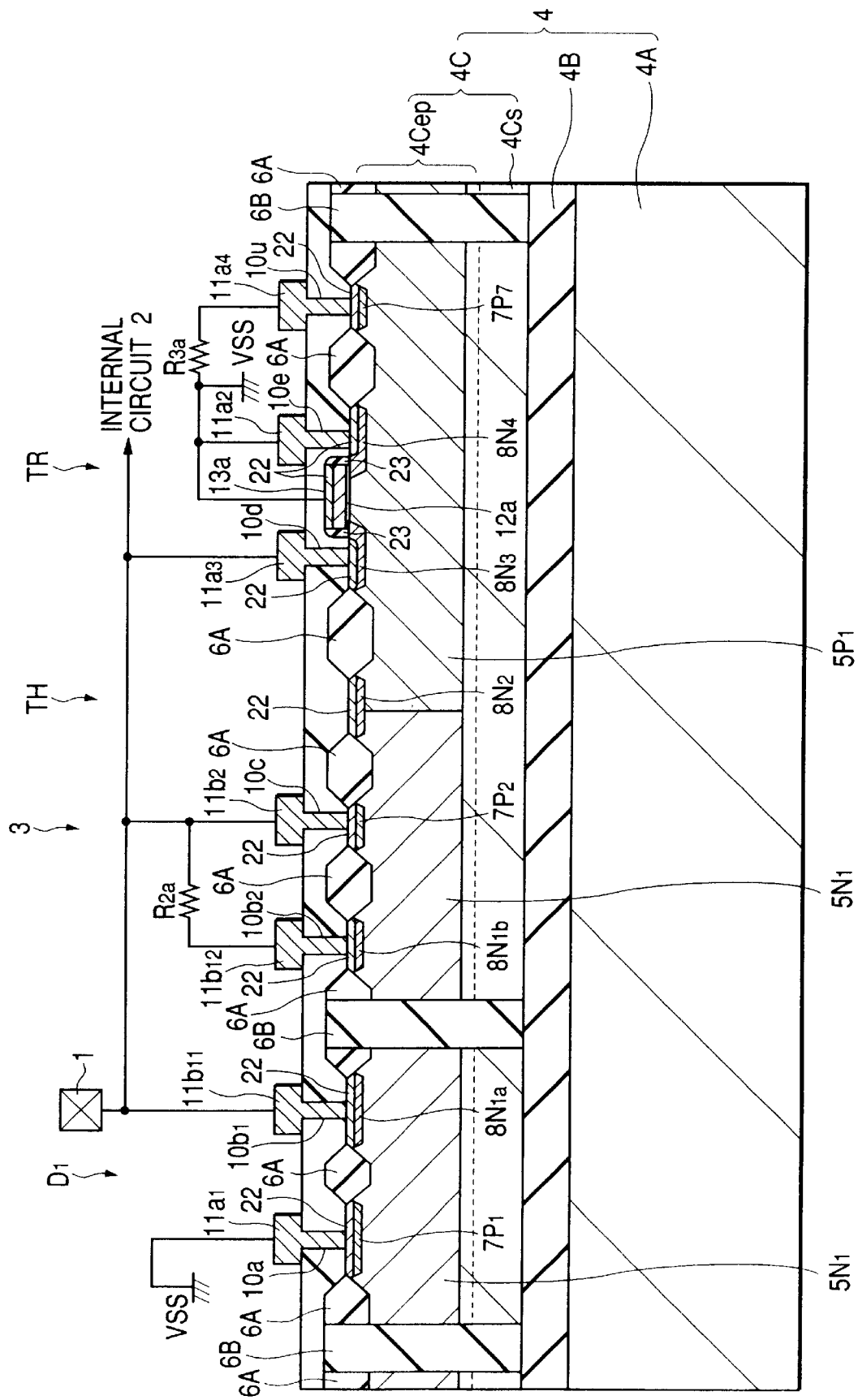
FIG. 22 is a fragmentary cross-sectional view of a semiconductor device showing a still further embodiment of the present invention.

The present fourth embodiment is one in which the technology of the second embodiment is applied to the third embodiment. Namely, in the fourth embodiment, silicide layers 22 are respectively formed on surface layers of $p^+$-type semiconductor regions 7P1, 7P2, and 7P7, n type semiconductor regions 8N1 through 8N4 and a gate electrode 13$a$, as shown in FIG. 22.

The fourth embodiment can obtain an effect similar to the second and third embodiments. According to the fourth embodiment in particular, since resistance values between respective electrodes of thyristor protective elements can suitably be adjusted with high accuracy by controlling the values of resistors R2$a$ and R3$a$, the operating characteristic of each thyristor protective element can be optimized.

The invention made by the present inventors has been described above specifically with reference to various embodiments. However, the present invention is not limited to the embodiments. It is needless to say that many changes can be made thereto within a scope not departing from the substance thereof.

For example, the first through fourth embodiments have been described for a the case in which the wirings are formed of aluminum or the like. However, the present invention is not limited thereto. The wirings may be formed of copper, for example. In that case, a multilayer interconnection structure may be configured by a so-called damascene or dual damascene method for forming wiring trenches in an interlayer dielectric and embedding a wiring material in the trenches to thereby form a wiring layer. Thus, the signal transmission rate can be increased. Further, each wiring can be scaled down. When copper is used for the wiring material, a barrier film for preventing the diffusion of copper, such as titanium nitride or the like, may preferably be provided on each inner wall surface of each wiring trench.

While the above description has principally been directed to a case in which the invention made by the present inventors is applied to a semiconductor device having a high-frequency signal circuit, which belongs to the field of application corresponding to the background of the invention, the present invention is not limited thereto. The present invention can be applied even to a semiconductor device having a memory circuit, such as a DRAM (Dynamic Random Access Memory), an SRAM (Static Random Access Memory) or flash memory (EERPOM: Electric Erasable Programmable Read Only Memory) or the like, a semiconductor device having a logic circuit like a microprocessor or the like, or a mixed-type semiconductor device in which the memory circuit and load circuit are provided on the same semiconductor substrate.

Advantageous effects obtained by typical aspects of the present invention will be described in brief as follows:

(1) According to the present invention, a gate of a thyristor for protection and a substrate electrode portion of a trigger element are provided within the same semiconductor region and are electrically connected to each other. Further, the thyristor for protection is driven based on a substrate current produced due to the breakdown of the trigger element, whereby the turn-on time of the protection thyristor constituting a protection circuit can be shortened.

(2) According to the above aspect (1), the discharge capability of a protection circuit having a thyristor for protection can be enhanced.

(3) According to the above aspects (1) and (2), a protection circuit configuration corresponding to the reduced scale of each element in an internal circuit can be implemented.

(4) According to the above aspects (1) and (2), an excessive current or overcurrent is allowed to escape promptly even in the case of a semiconductor device using a substrate in which a semiconductor layer is provided on an insulating layer.

(5) According to the present invention, a gate of a thyristor for protection and a substrate electrode portion of a trigger element are provided within the same semiconductor region and are electrically connected to each other, whereby each protection circuit can be scaled down and the resistance and parasitic capacitance between electrodes of elements constituting each protection circuit can be reduced. Thus, the discharge capability of the protection circuit can be enhanced without degrading electrical characteristics of an internal circuit.

(6) According to the present invention, a gate of a thyristor for protection and a substrate electrode portion of a trigger element are provided within the same semiconductor region and are electrically connected to each other. Further, the thyristor for protection is driven based on a substrate current produced due to the breakdown of the trigger element, whereby a structure is provided in which degradation of the sensitivity of the thyristor for protection is not produced by a change in the size of a semiconductor region for forming each protective element. Thus, the device design of a protection circuit can be facilitated.

What is claimed is:

1. A semiconductor device having at least a protective circuit with a thyristor structure connected between a first terminal and a second terminal, comprising:

a first semiconductor region of N-type conductivity;

a second semiconductor region of P-type conductivity being adjacent to said first semiconductor region;

a third semiconductor region of P-type conductivity provided in said first semiconductor region;

a conductive strip formed over said second semiconductor region via an insulating film;

a fourth semiconductor region and a fifth semiconductor region each being of N-type conductivity and provided in said second semiconductor region, said fourth semiconductor region being at one side of said conductive strip and said fifth semiconductor region being at the other side of said conductive strip, wherein said third and fourth semiconductor regions are electrically connected to said first terminal, said conductive strip and said fifth semiconductor region are electrically connected to said second terminal, and said first, second, third and fifth semiconductor regions act as said thyristor;

a sixth semiconductor region of N-type conductivity provided in said first semiconductor region; and a seventh semiconductor region of P-type conductivity provided in said second semiconductor region, wherein said sixth semiconductor region is electrically connected to said first terminal and said seventh semiconductor region is electrically connected to said second terminal.

2. A semiconductor device according to claim 1, wherein said third semiconductor region has higher impurity concentration than said second semiconductor region, and said fourth and fifth semiconductor regions have higher impurity concentration than said first semiconductor region.

3. A semiconductor device according to claim 2, further comprising:

an eighth semiconductor region of N-type conductivity extending across said first and second semiconductor regions.

4. A semiconductor device according to claim 3, further comprising:

an internal circuit including a P-channel MISFET and a N-channel MISFET each having gate electrode and source and drain regions, wherein said first terminal is electrically connected to said gate electrodes of said P-channel and N-channel MISFETs.

5. A semiconductor device according to claim 1, further comprising:

an eighth semiconductor region of N-type conductivity extending across said first and second semiconductor regions.

6. A semiconductor device according to claim 1, further comprising:

an internal circuit including a P-channel MISFET and a N-channel MISFET each having gate electrode and source and drain regions, wherein said first terminal is electrically connected to said gate electrodes of said P-channel and N-channel MISFETs.

7. A semiconductor device having at least a protective circuit with a thyristor structure connected between a first terminal and a second terminal, comprising:

a first semiconductor region of N-type conductivity;

a second semiconductor region of P-type conductivity being adjacent to said first semiconductor region;

a third semiconductor region of P-type conductivity provided in said first semiconductor region;

a conductive strip formed over said second semiconductor region via an insulating film;

a fourth semiconductor region and a fifth semiconductor region each being of N-type conductivity and provided in said second semiconductor region, said fourth semiconductor region being at one side of said conductive strip and said fifth semiconductor region being at the other side of said conductive strip, wherein said third and fourth semiconductor regions are electrically connected to said first terminal, said conductive strip and said fifth semiconductor region are electrically connected to said second terminal, and said first, second, third and fifth semiconductor regions act as said thyristor; and a sixth semiconductor region of N-type conductivity extending across said first and second semiconductor regions.

8. A semiconductor device according to claim 7, wherein said third semiconductor region has higher impurity concentration than said second semiconductor region, and said fourth and fifth semiconductor regions have higher impurity concentration than said first semiconductor region.

9. A semiconductor device according to claim 7, further comprising:

an internal circuit including a P-channel MISFET and a N-channel MISFET each having gate electrode and source and drain regions, wherein said first terminal is electrically connected to said gate electrodes of said P-channel and N-channel MISFETs.

* * * * *